(12) United States Patent
Fukuoka et al.

(10) Patent No.: US 8,963,315 B2
(45) Date of Patent: Feb. 24, 2015

(54) SEMICONDUCTOR DEVICE WITH SURFACE ELECTRODES

(75) Inventors: Daisuke Fukuoka, Nisshin (JP);
Takanori Teshima, Okazaki (JP);
Kuniaki Mamitsu, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 981 days.

(21) Appl. No.: 13/019,390

(22) Filed: Feb. 2, 2011

(65) Prior Publication Data

US 2011/0186981 A1  Aug. 4, 2011

(30) Foreign Application Priority Data

Feb. 4, 2010 (JP) .................................. 2010-022980
Apr. 20, 2010 (JP) .................................. 2010-097172

(51) Int. Cl.
*H01L 23/02* (2006.01)
*H01L 23/48* (2006.01)
(Continued)

(52) U.S. Cl.
CPC ................ *H01L 21/56* (2013.01); *H01L 23/48* (2013.01); *H01L 24/96* (2013.01);
(Continued)

(58) Field of Classification Search
CPC ............... H01L 2924/00014; H01L 2924/00; H01L 2224/48247; H01L 2224/48091; H01L 2924/00013; H01L 2924/13055; H01L 21/56; H01L 2224/04026; H01L 2224/32245; H01L 2224/33181; H01L 23/48; H01L 24/96; H01L 2924/15159; H01L 21/4814; H01L 21/4821; H01L 21/4825; H01L 21/4871; H01L 21/4875; H01L 2023/4037; H01L 2023/4043; H01L 2023/4068
USPC ......... 257/181, 690, 691, 701, 706, 796, 712, 257/773, 776, 785, 786, 787; 361/704
See application file for complete search history.

(56) References Cited

U.S. PATENT DOCUMENTS 3,559,001 A * 1/1971 Cooper et al. ................... 57/689
3,986,201 A * 10/1976 Herold et al. .................. 257/689
(Continued)

FOREIGN PATENT DOCUMENTS

JP 07-14955 A 1/1995
JP A-2000-031351 1/2000
(Continued)

OTHER PUBLICATIONS

Office Action mailed Jun. 19, 2012 in corresponding JP Application No. 2010-097172 (and English translation).

*Primary Examiner* — Teresa M Arroyo
(74) *Attorney, Agent, or Firm* — Posz Law Group, PLC

(57) ABSTRACT

A semiconductor device includes a plate-shaped semiconductor element and an electrically insulating resin member. The semiconductor element has a front-surface electrode on its front surface and a back-surface electrode on its back surface. The resin member encapsulates the semiconductor element. The front-surface electrode is exposed to a front side of an outer surface of the resin member. The back-surface electrode is exposed to a back side of the outer surface of the resin member. The resin member has an extension portion that covers the entire side surface of the semiconductor element and extends from the side surface of the semiconductor element in a direction parallel to the front surface of the semiconductor element.

13 Claims, 32 Drawing Sheets

(51) Int. Cl.
*H01L 23/52* (2006.01)
*H01L 23/12* (2006.01)
*H01L 23/053* (2006.01)
*H01L 23/10* (2006.01)
*H01L 23/34* (2006.01)
*H01L 29/40* (2006.01)
*H01L 23/28* (2006.01)
*H01L 21/56* (2006.01)
*H01L 23/00* (2006.01)

(52) U.S. Cl.
CPC ............... *H01L 2224/73269* (2013.01); *H01L 2224/04026* (2013.01); *H01L 2224/0405* (2013.01); *H01L 2224/32245* (2013.01); *H01L 2224/33181* (2013.01); *H01L 2224/73219* (2013.01); *H01L 2924/15159* (2013.01); *H01L 2924/13055* (2013.01)
USPC ........... 257/690; 257/181; 257/691; 257/701; 257/706; 257/773; 257/785; 257/786; 257/787

(56) References Cited

U.S. PATENT DOCUMENTS

| | | | | |
|---|---|---|---|---|
| 4,141,030 | A | * | 2/1979 | Eisele et al. .................. 257/689 |
| 4,240,099 | A | * | 12/1980 | Brandt et al. .................. 257/739 |
| RE43,663 | E | * | 9/2012 | Kawashima et al. ......... 257/678 |
| 2002/0158333 | A1 | * | 10/2002 | Teshima ........................ 257/718 |
| 2002/0192442 | A1 | | 12/2002 | Kondo et al. |
| 2004/0091687 | A1 | | 5/2004 | Kondo et al. |
| 2004/0119089 | A1 | * | 6/2004 | Merlin et al. .................. 257/181 |
| 2005/0040515 | A1 | * | 2/2005 | Inoue et al. .................... 257/706 |
| 2006/0043618 | A1 | | 3/2006 | Ashida et al. |
| 2007/0145540 | A1 | * | 6/2007 | Mochida ........................ 257/659 |
| 2007/0216013 | A1 | * | 9/2007 | Funakoshi et al. ............ 257/691 |
| 2008/0224303 | A1 | * | 9/2008 | Funakoshi et al. ............ 257/701 |
| 2009/0194862 | A1 | * | 8/2009 | Kitami ........................... 257/690 |
| 2013/0099364 | A1 | * | 4/2013 | Liu et al. ....................... 257/675 |

FOREIGN PATENT DOCUMENTS

| | | |
|---|---|---|
| JP | 3525832 B2 | 2/2004 |
| JP | 3809550 B2 | 6/2006 |

* cited by examiner

SEMICONDUCTOR DEVICE WITH SURFACE ELECTRODES

CROSS REFERENCE TO RELATED APPLICATION

This application is based on and claims priority to Japanese Patent Application No. 2010-22980 filed on Feb. 4, 2010 and No. 2010-97172 filed on Apr. 20, 2010, the contents of which are incorporated by reference.

FIELD OF THE INVENTION

The present invention relates to a semiconductor device including a semiconductor element having electrodes on its front and back surfaces and configured to allow the electrodes to be electrically and thermally connected to a heatsink on the front and back surfaces of the semiconductor element. The present invention also relates to a method of manufacturing the semiconductor device.

BACKGROUND OF THE INVENTION

In a semiconductor device disclosed in JP 3525832, a front-surface electrode and a back-surface electrode are provided on a front surface and a back surface of a plate-shaped semiconductor element, respectively, and heatsinks made of metal such as copper (Cu) are placed on both surfaces of the semiconductor element so that the semiconductor element can be cooled from both surfaces. The electrodes are electrically and thermally connected to the heatsinks through a joint member such as solder.

However, in such a semiconductor device as disclosed in JP 3525832, there is a concern that the solder may be cracked or detached by thermal stress applied between the heatsink (e.g., made of copper) and the semiconductor element (e.g., made of silicon) due to a difference in coefficient of thermal expansion between the heatsink and the semiconductor element. In addition, since compressive stress is applied from the heatsink through solder to the semiconductor element during a high-temperature process such as a reflow soldering, additional processing, such as thinning of the semiconductor element, is required to reduce the stress applied to the semiconductor element.

JP 3809550 discloses another semiconductor device. According to the semiconductor device disclosed in JP 3809550, multiple semiconductor elements are arranged in parallel in a package, and front-surface and back-surface electrodes of each semiconductor element are in surface contact with top and bottom heatsinks of the package under pressure to the heatsinks from outside. In such an approach, the problem caused by the use of solder may be prevented.

The semiconductor device disclosed in JP 3809550 includes not only a tube made of an electrically insulating ceramic material placed between the heatsinks to increase a creepage distance between the front-surface and back-surface electrodes of the semiconductor element but also a supporting member placed between adjacent semiconductor elements. Therefore, a large number of parts and manufacturing processes are required.

SUMMARY OF THE INVENTION

In view of the above, it is an object of the present invention to provide a semiconductor device configured such that front-surface and back-surface electrodes of a semiconductor element are electrically and thermally connected to heatsinks under pressure from the heatsinks while ensuring a creepage distance between the front-surface and back-surface electrodes without using an additional separate insulating member. It is another object of the present invention to provide a method of manufacturing the semiconductor device.

According to a first aspect of the present invention, a semiconductor device includes a plate-shaped semiconductor element and an electrically insulating resin member. The plate-shaped semiconductor element has a front surface, a back surface opposite to the front surface, and a side surface between the front surface and the back surface. The semiconductor element includes a front-surface electrode on the front surface and a back-surface electrode on the back surface. The resin member encapsulates and seals the semiconductor element. The front-surface electrode has an exposed surface exposed to a front side of an outer surface of the resin member. The back-surface electrode has an exposed surface exposed to a back side of the outer surface of the resin member. The resin member has an extension portion that covers the entire side surface of the semiconductor element and extends from the side surface of the semiconductor element in a direction parallel to the front surface of the semiconductor element. The resin member and the first extension portion are a single piece of resin.

According to a second aspect of the present invention, a method of manufacturing a semiconductor device includes preparing a plate-shaped semiconductor element having a front-surface electrode on its front surface and a back-surface electrode on its back surface, encapsulating the entire semiconductor element with an electrically insulating resin member in such a manner that the front surface, the back surface, and a side surface between the front surface and the back surface of the semiconductor element is covered with the resin member; and forming the resin member into a predetermined shape by partially removing the resin member in such a manner that the front-surface electrode and the back-surface electrode of the semiconductor element are exposed to an outer surface of the resin member and that the entire side surface of the semiconductor element is covered with an extension portion of the resin member. The extension portion extends from the side surface of the semiconductor element in a direction parallel to the front surface of the semiconductor element.

According to a third aspect of the present invention, a method of manufacturing a semiconductor device includes preparing a plate-shaped semiconductor element having a front-surface electrode on its front surface and a back-surface electrode on its back surface, placing the semiconductor element in a mold in such a manner that the front-surface electrode and the back-surface electrode of the semiconductor element are in close contact with an inner surface of the mold and that an entire side surface between the front surface and the back surface of the semiconductor element is exposed to a cavity of the mold, and injecting an electrically insulating resin material into the cavity of the mold to encapsulate the semiconductor element with an electrically insulating resin member in such a manner that the front-surface electrode and the back-surface electrode of the semiconductor element are exposed to an outer surface of the resin member and that the entire side surface of the semiconductor element is covered with an extension portion of the resin member. The extension portion extends from the side surface of the semiconductor element in a direction parallel to the front surface of the semiconductor element.

According to a fourth aspect of the present invention, a method of manufacturing a semiconductor device includes preparing a plate-shaped semiconductor element having a front-surface electrode on its front surface and a back-surface electrode on its back surface, preparing a first resin sheet made of thermoplastic resin and having first and second surfaces opposite to each other. The first resin sheet includes a first conductive member extending from the first surface to the second surface of the first resin sheet. The method further includes preparing a second resin sheet made of the thermoplastic resin and having first and second surfaces opposite to each other. The second resin sheet includes a second conductive member extending from the first surface to the second surface of the second resin sheet. The method further includes preparing a third resin sheet made of the thermoplastic resin and having first and second surfaces opposite to each other. The third resin sheet defines a through hole extending from the first surface to the second surface of the third resin sheet. The method further includes placing the semiconductor element in the through hole of the third resin sheet in such a manner that the front surface and the back surface of the semiconductor element are exposed to the first and second surfaces of the third resin sheet, respectively, and that an entire side surface between the front surface and the back surface of the semiconductor element is covered with the third resin sheet. The method further includes covering the front surface of the semiconductor element with the first resin sheet by placing the first resin sheet on the third resin sheet in such a manner that the first surface of the first resin sheet is in direct contact with the first surface of the third resin sheet and that the first conductive member is electrically connected to the front-surface electrode. The method further includes covering the back surface of the semiconductor element with the second resin sheet by placing the second resin sheet on the third resin sheet in such a manner that the first surface of the second resin sheet is in direct contact with the second surface of the third resin sheet and that the second conductive member is electrically connected to the back-surface electrode. The method further includes fusion-bonding the first resin sheet, the second resin sheet, and the third resin sheet together by Pressing the first resin sheet and the second resin sheet against the third resin sheet under application of heat.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 1A:
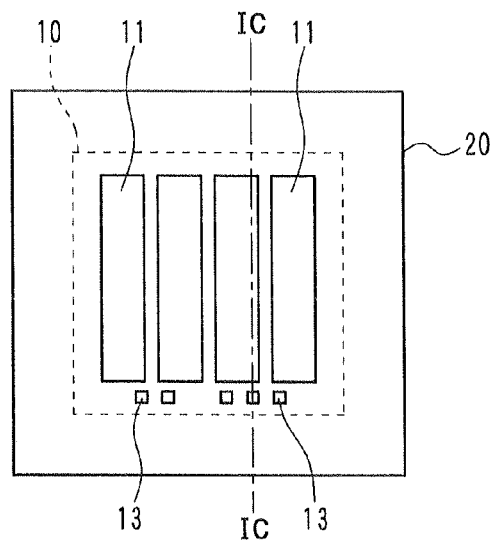
FIG. 1A is a diagram illustrating a plan view of a semiconductor package of a semiconductor device according to a first embodiment of the present invention.

Embodiments of the present invention are described below with reference to the drawings. Throughout the embodiments, the same symbols are given to the same or corresponding parts in the drawings.

First Embodiment

Figure 1B:
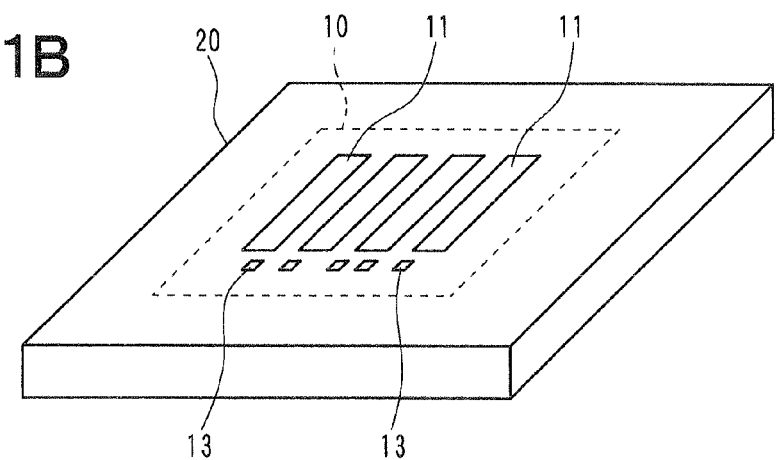
FIG. 1B is a diagram illustrating a perspective view of the semiconductor package of FIG. 1A.
Figure 1C:
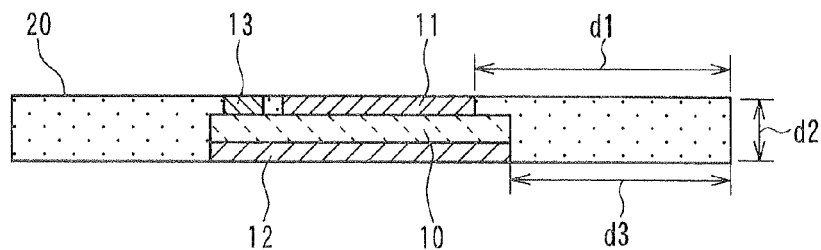
FIG. 1C is a diagram illustrating a cross-sectional view taken along the line IC-IC in FIG. 1A.
Figure 2A:
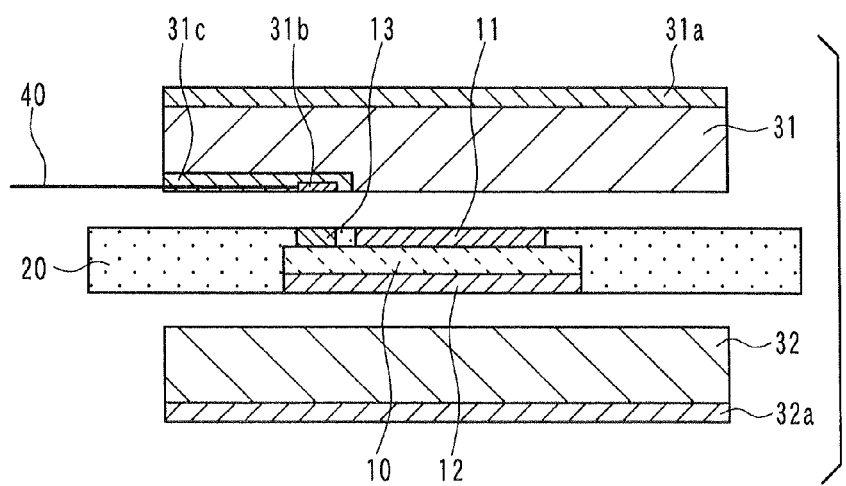
FIG. 2A is a diagram illustrating a cross-sectional exploded view of the semiconductor device according to the first embodiment.
Figure 2B:
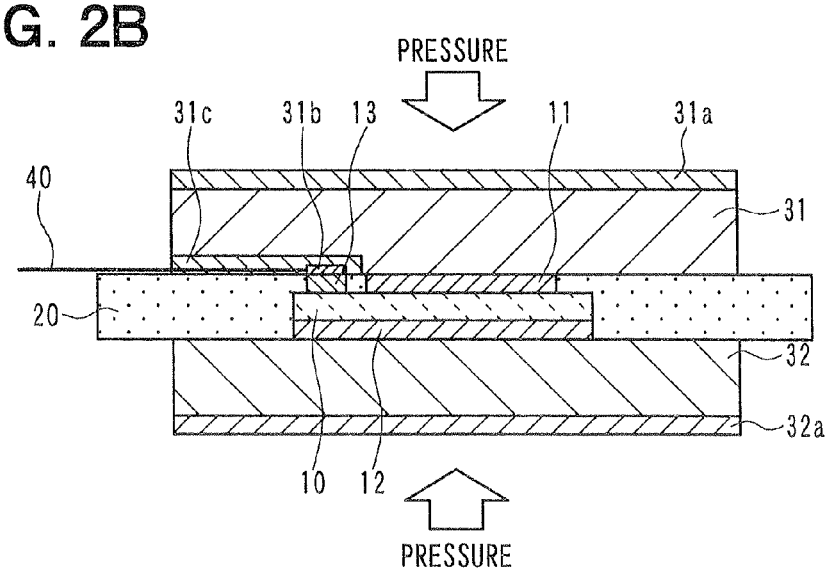
FIG. 2B is a diagram illustrating a cross-sectional view of the semiconductor device according to the first embodiment.

A semiconductor device according to a first embodiment of the present is described below with reference to FIGS. 1A-1C, 2A, and 2B. FIG. 1A is a plan view of a semiconductor package of the semiconductor device viewed from a front surface side of a semiconductor element 10 packaged in the semiconductor package. FIG. 1B is a perspective view of the semiconductor package viewed from the front surface side of the semiconductor element 10. FIG. 1C is a cross-sectional view taken along the line IC-IC in FIG. 1A. FIG. 2A is a cross-sectional exploded view of the semiconductor device. FIG. 2B is a cross-sectional view of the semiconductor device.

In an example shown in FIGS. 1A-1C, the semiconductor element 10 has a rectangular plate shape with front and back surfaces and four side surfaces between the front and back surfaces. The front and back surfaces are opposite to each other, and each side surface is perpendicular to the front and back surfaces. The semiconductor element 10 includes a front-surface electrode 11 on the front surface and a back-surface electrode 12 on the back surface.

For example, the semiconductor element 10 can be an insulated gate bipolar transistor (IGBT). Assuming that the semiconductor element 10 is an IGBT, the front-surface electrode 11 is an emitter electrode, and the back-surface electrode is a collector electrode.

In the example shown in FIGS. 1A-1C, multiple front-surface electrodes 11, each of which has a long narrow rectangular shape like a strip, are arranged in a predetermined pattern on the front surface of the semiconductor element 10. On the other hand, the back-surface electrode 12 has the same planer shape as the back surface of the semiconductor element 10 so as to cover the entire back surface of the semiconductor element 10. As shown in FIGS. 2A and 2B, which will be described later, the front-surface electrode 11 and the back-surface electrode 12 are connected to a first heatsink 31 and a second heatsink 32, respectively. Each of the first heatsink 31 and the second heatsink 32 has a heat radiation property and an electrical conductivity. The front-surface electrode 11 and the back-surface electrode 12 are electrically connected to external circuitry through the first heatsink 31 and the second heatsink 32, respectively.

In addition to the front-surface electrode 11, a lead terminal electrode pad 13 is provided on the front surface of the semiconductor element 10. For example, the lead terminal electrode pad 13 can lead to a gate electrode, a temperature sensing electrode, or the like. As shown in FIGS. 2A and 2B, which will be described later, the lead terminal electrode pad 13 is connected to a lead terminal 40 through a heatsink-side pad 31b and electrically connected to external circuitry through the lead terminal 40.

The front-surface electrode 11, the back-surface electrode 12, and the lead terminal electrode pad 13 can be made of a typical conductive material used for an electrode of a semiconductor element. For example, the front-surface electrode 11 as an emitter electrode and the lead terminal electrode pad 13 can be made of Al or Al alloy, and the back-surface electrode 12 as a collector electrode can be a multilayer structure such as Ti/Ni/Au.

As described above, according to the first embodiment, the semiconductor element 10 has multiple front-surface electrodes 11 on the front surface and a single back-surface electrode 12 on the back surface. Alternatively the semiconductor element 10 can have a single front-surface electrode 11 on the front surface and multiple back-surface electrodes 12 on the back surface. Alternatively, the semiconductor element 10 can have a single front-surface electrode 11 on the front surface and a single back-surface electrode 12 on the back surface. Alternatively, the semiconductor element 10 can have the multiple front-surface electrodes 11 on the front surface and multiple back-surface electrodes 12 on the back surface.

The semiconductor element 10 is encapsulated and sealed in a resin member 20 having an electrical insulating property. For example the resin member 20 can be made of a resin material such as epoxide resin, which is used as a sealing material for electronic components. For example, the resin member 20 can be formed by using a metal mold. In this way, the semiconductor element 10 having the front-surface electrode 11 and the back-surface electrode 12 are encapsulated and sealed in the resin member 20 to form the semiconductor package shown in FIGS. 1A-1C.

It is noted that the front-surface electrode 11 and the back-surface electrode 12 are exposed to an outer surface of the resin member 20. The resin member 20 covers the entire side surfaces (i.e., all the four side surfaces) of the semiconductor element 10. The resin member 20 has an extension portion that extends from each side surface of the semiconductor element 10 in a direction parallel to the front surface of the semiconductor element 10.

Specifically, the front and back surfaces of the semiconductor element 10, except for the front-surface electrode 11 and the back-surface electrode 12, are covered and sealed with the resin member 20, and each side surface of the semiconductor element 10 is covered and sealed with the extension portion of the resin member 20.

Like the front-surface electrode 11, the lead terminal electrode pad 13 is exposed to the outer surface of the resin member 20 on the front surface-side of the semiconductor element 10. Since the back-surface electrode 12 is formed on the entire back surface of the semiconductor element 10, the entire back-surface electrode 12 is exposed to the outer surface of the resin member 20 on the back surface-side of the semiconductor element 10. An outer surface of the front-surface electrode 11 exposed to the outer surface of the resin member 20 is hereinafter called the "exposed surface of the front-surface electrode 11. An outer surface of the back-surface electrode 12 exposed to the outer surface of the resin member 20 is hereinafter called the "exposed surface of the back-surface electrode 12. An outer surface of the lead terminal electrode pad 13 exposed to the outer surface of the resin member 20 is hereinafter called the "exposed surface of the lead terminal electrode pad 13.

As described above, the entire side surface of the semiconductor element 10 located between the front-surface electrode 11 and the back-surface electrode 12 is covered with the resin member 20 having an electrical insulating property. Further, the resin member 20 has the extension portion that extends from each side surface of the semiconductor element 10 in the direction parallel to the front surface of the semiconductor element 10. Thus, the extension portion of the resin member 20 increases a creepage distance between the front-surface electrode 11 and the back-surface electrode 12.

The creepage distance between the front-surface electrode 11 and the back-surface electrode 12 is a distance between the exposed surface of the front-surface electrode 11 and the exposed surface of the back-surface electrode 12 along the outer surface of the extension portion of the resin member 20. In the example shown in FIG. 1C, the creepage distance is the sum of a distance d1, a distance d2, and a distance d3. The distance d1 is a distance from the exposed surface of the front-surface electrode 11 to an outer edge of the resin member 20. The distance d2 is a thickness of the resin member 20. The distance d3 is a distance from the exposed surface of the back-surface electrode 12 to the outer edge of the resin member 20.

The creepage distance (i.e., d1+d2+d3) is determined to prevent a tracking phenomenon along the outer surface of the resin member 20 from occurring even when the maximum rating voltage of the semiconductor element 10 is applied between the front-surface electrode 11 and the back-surface electrode 12.

As described above, according to the first embodiment, the semiconductor package is configured such that the front-surface electrode 11 and the back-surface electrode 12 of the semiconductor element 10 are exposed to the outer surface of the resin member 20. Therefore, as shown in FIGS. 2A and 2B, which will be described later, the first heatsink 31 and the second heatsink 32 can be brought into contact with the front-surface electrode 11 and the back-surface electrode 12, respectively, by applying pressure to the first heatsink 31 and the second heatsink 32 against the semiconductor package. Further, since the lead terminal electrode pad 13 is exposed to the outer surface of the resin member 20, the first heatsink 31 can be brought into contact with the lead terminal electrode pad 13 in addition to the front-surface electrode 11.

As shown in FIG. 1C, it is preferable that the exposed surfaces of the front-surface electrode 11, the back-surface electrode 12, and the lead terminal electrode pad 13 be flush with the outer surface of the resin member 20. In such an approach, the first heatsink 31 and the second heatsink 32 can be surely in contact with the front-surface electrode 11, the back-surface electrode 12, and the lead terminal electrode pad 13 by applying pressure to the first heatsink 31 and the second heatsink 32 against the semiconductor package.

Alternatively, at least one of the exposed surfaces of the front-surface electrode 11, the back-surface electrode 12, and the lead terminal electrode pad 13 can be recessed or project from the outer surface of the resin member 20. In this case, the first heatsink 31 or the second heatsink 32 need to have a corresponding projection or recess engageable with the at least one of the exposed surfaces of the front-surface electrode 11, the back-surface electrode 12, and the lead terminal electrode pad 13. In such an approach, the first heatsink 31 and the second heatsink 32 can be surely in contact with the front-surface electrode 11, the back-surface electrode 12, and the lead terminal electrode pad 13.

The thickness of the extension portion of the resin member 20, i.e., the distance d2 is equivalent to the thickness of the semiconductor element 10 including the front-surface electrode 11 and the back-surface electrode 12. Thus the exposed surfaces of the front-surface electrode 11 and the back-surface electrode 12 can be flush with the outer surface of the resin member 20.

As described above, according to the semiconductor package shown in FIGS. 1A-1C, the entire side surface of the semiconductor element 10 located between the front-surface electrode 11 and the back-surface electrode 12 is covered with the resin member 20 having an electrical insulating property. Further, the resin member 20 has the extension portion that extends from each side surface of the semiconductor element 10 in the direction parallel to the front surface of the semiconductor element 10. Thus, the extension portion of the resin member 20 increases the creepage distance between the front-surface electrode 11 and the back-surface electrode 12. Furthermore the front-surface electrode 11 and the back-surface electrode 12 are exposed to the outer surface of the resin member 20. Therefore, as shown in FIGS. 2A and 2B, which will be describe later, the first heatsink 31 and the second heatsink 32 can be brought into contact with the front-surface electrode 11 and the back-surface electrode 12 of the semiconductor element 10 by applying pressure to the first heatsink 31 and the second heatsink 32 against the semiconductor package.

The resin member 20 and the extension portion are one piece of a resin material. Thus, the creepage distance between the front-surface electrode 11 and the back-surface electrode 12 of the semiconductor element 10 can be increased enough to prevent a tracking phenomenon without using additional electrically insulating member such as used in the prior-art. Further, since the resin member 20 is made of a resin material, the resin member 20 can be elastically deformed. Therefore when the semiconductor package is under pressure from the first heatsink 31 and the second heatsink 32, the resin member 20 is deformed so that the first heatsink 31 and the second heatsink 32 can be surely in contact with the front-surface electrode 11 and the back-surface electrode 12 of the semiconductor element 10.

Further, according to the semiconductor package shown in FIGS. 1A-1C, the exposed surfaces of the front-surface electrode 11 and the back-surface electrode 12 are flush with the outer surface of the resin member 20 around the exposed surfaces. In such an approach, when the first heatsink 31 and the second heatsink 32 have flat surfaces to be brought into contact with the exposed surfaces of the front-surface electrode 11 and the back-surface electrode 12, the flat surfaces of the first heatsink 31 and the second heatsink 32 can be surely in contact with the exposed surfaces of the front-surface electrode 11 and the back-surface electrode 12.

FIG. 2A illustrates a cross-sectional exploded view of the semiconductor device according to the first embodiment. FIG. 2B illustrates a cross-sectional view of the semiconductor device as an assembled product.

The first heatsink 31 is provided on the front surface side of the semiconductor element 10. In FIG. 2B, the first heatsink 31 is under pressure so that the first heatsink 31 can be in direct contact with both the outer surface of the resin member 20 and the exposed surface of the front-surface electrode 11.

As mentioned previously, the first heatsink 31 has a heat radiation property and an electrical conductivity.

The second heatsink 32 is provided on the back surface side of the semiconductor element 10. In FIG. 2B, the second heatsink 32 is under pressure so that the second heatsink 32 can be in direct contact with both the outer surface of the resin member 20 and the exposed surface of the back-surface electrode 12. As mentioned previously, the second heatsink 32 has a heat radiation property and an electrical conductivity. For example, each of the first heatsink 31 and the second heatsink 32 can be made of copper (Cu) and iron (Fe) and have a plate-like shape.

The first heatsink 31 has a first contact surface and a first cooling surface opposite to the first contact surface. The first contact surface of the first heatsink 31 is flat and brought into contact with the exposed surface of the front-surface electrode 11. A first electrically insulating film 31a is provided on the first cooling surface of the first heatsink 31. Likewise, the second heatsink 32 has a second contact surface and a second cooling surface opposite to the second contact surface. The second contact surface of the second heatsink 32 is flat and brought into contact with the exposed surface of the back-surface electrode 12. A second electrically insulating film 32a is provided on the second cooling surface of the second heatsink 32.

The first and second electrically insulating films 32a and 32b can be formed by a sputtering method, a vapor deposition method, or the like. For example, the first and second electrically insulating films 32a and 32b can be a silicon oxide film, a silicon nitride film, a polyimide coating film, a ceramic film, or the like. When the first and second heatsinks 31 and 32 are brought into contact with external cooling members, the first and second electrically insulating films 32a and 32b can allow the first and second heatsinks 31 and 32 to be electrically insulated from the external cooling members.

In the example shown in FIGS. 2A and 2B, the extension portion of the resin member 20 extends over an outer edge of the first heatsink 31 and also extends over an outer edge of the second heatsink 32. Specifically, the size of each of the first heatsink 31 and the second heatsink 32 is slightly larger than the size of the semiconductor element 10 and slightly smaller than the size of the resin member 20.

In such an approach, the extension portion of the resin member 20 can increase a creepage distance between the first heatsink 31 and the second heatsink 32. If the creepage distance between the first heatsink 31 and the second heatsink 32 is enough large, there is no need that the resin member 20 extends over the outer edges of the first heatsink 31 and the second heatsink 32.

As mentioned previously, the lead terminal electrode pad 13 is exposed to the outer surface of the resin member 20 on the front surface side of the semiconductor element 10. The lead terminal electrode pad 13 is connected to the lead terminal 40 through the heatsink-side pad 31b and electrically connected to external circuitry through the lead terminal 40.

Specifically, the heatsink-side pad 31b is provided on the first contact surface of the first heatsink 31 at a position corresponding to the lead terminal electrode pad 13. The heatsink-side pad 31b is connected to the lead terminal 40.

Further, an electrically insulating film 31c is interposed between the first heatsink 31 and each of the heatsink-side pad 31b and the lead terminal 40 to electrically insulate the first heatsink 31 from the heatsink-side pad 31b and the lead terminal 40. The heatsink-side pad 31b and the lead terminal electrode pad 13 are in direct contact with each other and electrically connected to each other, when the semiconductor package is under pressure from the first heatsink 31 and the second heatsink 32. For example, the semiconductor package can be under pressure from the first heatsink 31 and the second heatsink 32 by sandwiching the semiconductor package between the first and second heatsinks 31 and 32 using a pressing member such as a screw, a spring, and/or the like.

The electrically insulating film 31c can be formed on the first contact surface of the first heatsink 31 by a typical deposition method. For example, the electrically insulating film 31c can be a silicon oxide film, a silicon nitride film, or the like.

The heatsink-side pad 31b is formed on the electrically insulating film 31c. For example, the heatsink-side pad 31b can be a metal film such as an aluminum film. The heatsink-side pad 31b is located at the position corresponding to the lead terminal electrode pad 13 of the semiconductor element 10. Since the electrically insulating film 31c is located between the first heatsink 31 and the heatsink-side pad 31b, the first heatsink 31 and the heatsink-side pad 31b are electrically insulated from each other by the electrically insulating film 31c.

For example, the lead terminal 40 can be a lead frame made of metal such as cupper. The lead terminal 40 is located on the electrically insulating film 31c and joined to the heatsink-side pad 31b. For example, the lead terminal 40 can be joined to the heatsink-side pad 31b by soldering, ultrasonic bonding, or the like. According to the structure shown in FIGS. 2A and 2B, although the lead terminal 40 is provided to the first heatsink 31, the lead terminal 40 can be electrically insulated from the first heatsink 31.

In the way, the semiconductor package and the first and second heatsinks 31 and 32 are assembled into the semiconductor device in such a manner that the front-surface electrode 11 and the back-surface electrode 12 of the semiconductor element 10 are in direct contact with the first heatsink 31 and the second heatsink 32 under pressure from the first heatsink 31 and the second heatsink 32.

In such an approach, the semiconductor element 10 can be electrically and thermally connected to the first heatsink 31 and the second heatsink 32 without using a joint member such as solder. Therefore there is no need to take into considerations durability of the joint member, the semiconductor device can be used in high temperature environments. Further, since there is no thermal stress from the first heatsink 31 and the second heatsink 32 to the semiconductor element 10 through the joint member, there is no need to thin the semiconductor element 10 so that the thickness of the semiconductor element 10 can be maintained.

Second Embodiment

Figure 3A:
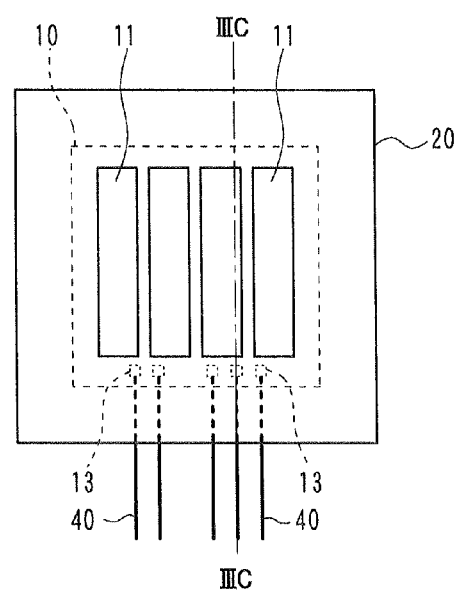
FIG. 3A is a diagram illustrating a plan view of a semiconductor package of a semiconductor device according to a second embodiment of the present invention.
Figure 3B:
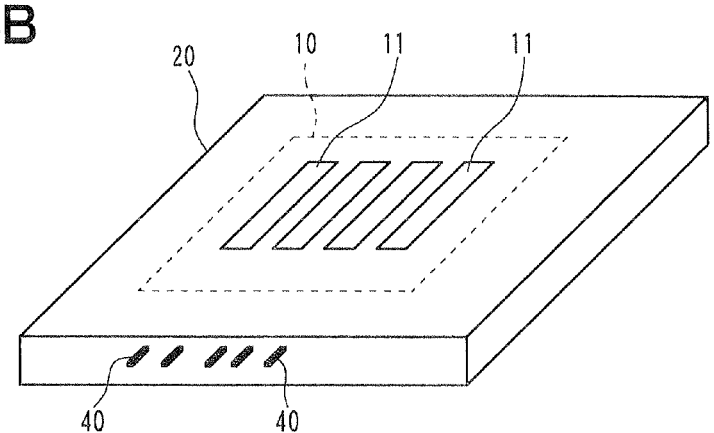
FIG. 3B is a diagram illustrating a perspective view of the semiconductor package of FIG. 3A.
Figure 3C:
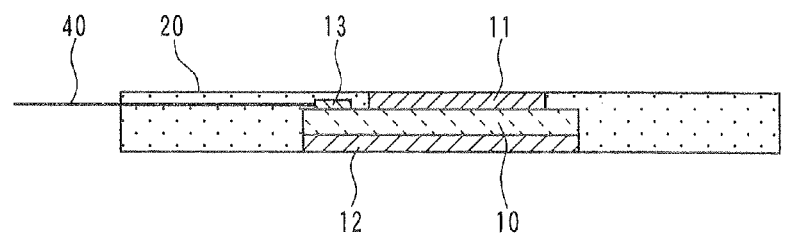
FIG. 3C is a diagram illustrating a cross-sectional view taken along the line IIIC-IIIC in FIG. 3A.

A semiconductor device according to a second embodiment of the present invention is described below with reference to FIGS. 3A-3C, 4A, and 4B. FIG. 3A is a plan view of a semiconductor package of the semiconductor device viewed from a front surface side of a semiconductor element 10 packaged in the semiconductor package. FIG. 3B is a perspective view of the semiconductor package viewed from the front surface side of the semiconductor element 10. FIG. 3C is a cross-sectional view taken along the line IIIC-IIIC in FIG. 3A. A difference between the first embodiment and the second embodiment is as follows.

As shown in FIGS. 3A-3C, according to the second embodiment, the lead terminal 40 is provided to the semiconductor element 10 not to the first heatsink 31. Therefore, the first heatsink 31 does not have the heatsink-side pad 31b and the electrically insulating film 31c.

The lead terminal 40 is joined to the lead terminal electrode pad 13 on the front surface of the semiconductor element 10 by soldering, ultrasonic bonding, or the like. Then, the semiconductor element 10 including the lead terminal electrode pad 13 and the lead terminal 40 joined to the lead terminal electrode pad 13 is encapsulated and sealed in the resin member 20 to form the semiconductor package.

Figure 4A:
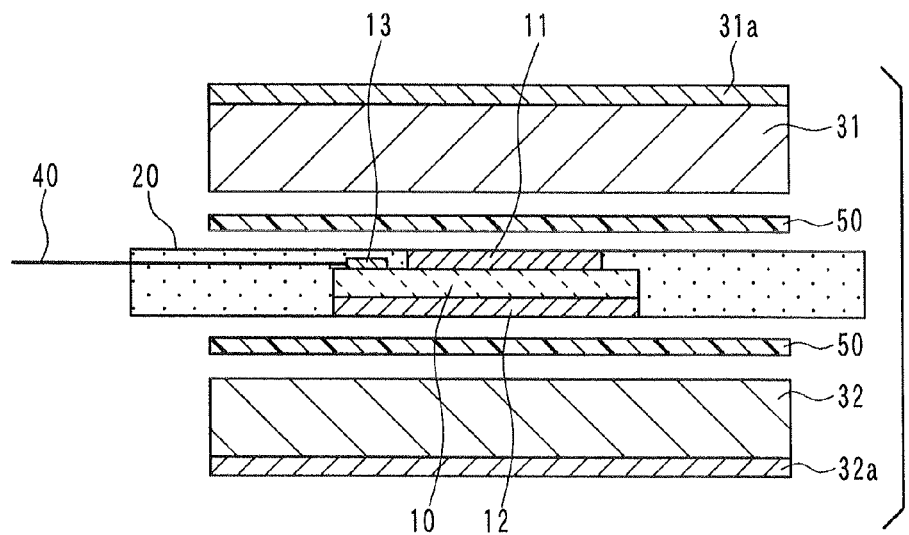
FIG. 4A is a diagram illustrating a cross-sectional, exploded view of the semiconductor device according to the second embodiment.
Figure 4B:
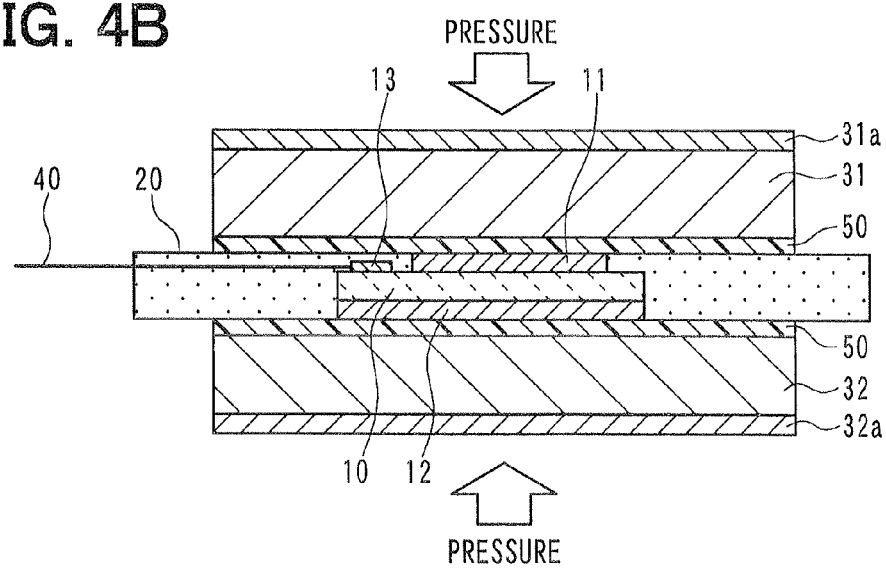
FIG. 4B is a diagram illustrating a cross-sectional view of the semiconductor device according to the second embodiment.

FIG. 4A illustrates a cross-sectional exploded view of the semiconductor device according to the second embodiment. FIG. 4B illustrates a cross-sectional view of the semiconductor device as an assembled product.

The first and second heatsinks 31 and 32 shown in FIGS. 4A and 4B are the same as those shown in FIGS. 2A and 2B except that the lead terminal electrode pad 13 and the lead terminal 40 are encapsulated with the resin member 20. Like the first embodiment, the first and second heatsinks 31 and 32 are pressed against the semiconductor package so that the first and second heatsinks 31 and 32 can be electrically connected to the front-surface and back-surface electrodes 11 and 12.

As shown in FIG. 4A, according to the second embodiment an Interposer 50 is interposed between the first heatsink 31 and the front-surface electrode 11 and also interposed between the second heatsink 32 and the back-surface electrode 12. For example, the interposer 50 can be made of a soft and electrically conductive material such as an electrically conductive resin film. As shown in FIG. 4B, the first heatsink 31 and the second heatsink 32 are brought into contact with the front-surface electrode 11 and the back-surface electrode 12 of the semiconductor element 10 through the interposer 50 by pressing the first heatsink 31 and the second heatsink 32 against the semiconductor package. In such an approach, the interposer 50 increases adhesion between the first heatsink 31 and the front-surface electrode 11 and also increases adhesion between the second heatsink 32 and the back-surface electrode 12. It is noted that the interposer 50 is optional and can be removed as necessary.

As described above, according to the second embodiment the lead terminal 40 is provided to the semiconductor element 10. In such an approach, the semiconductor package, the first heatsink 31, and the second heatsink 32 can be assembled into the semiconductor device without alignment between the heatsink-side pad 31b and the lead terminal electrode pad 13.

Third Embodiment

Figure 5A:
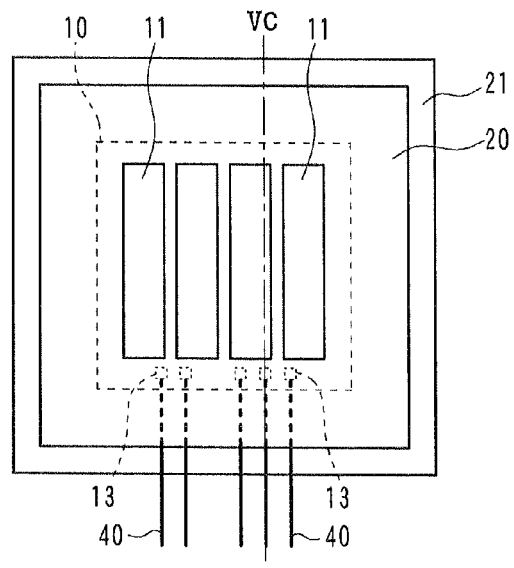
FIG. 5A is a diagram illustrating a plan view of a semiconductor package of a semiconductor device according to a third embodiment of the present invention.
Figure 5B:
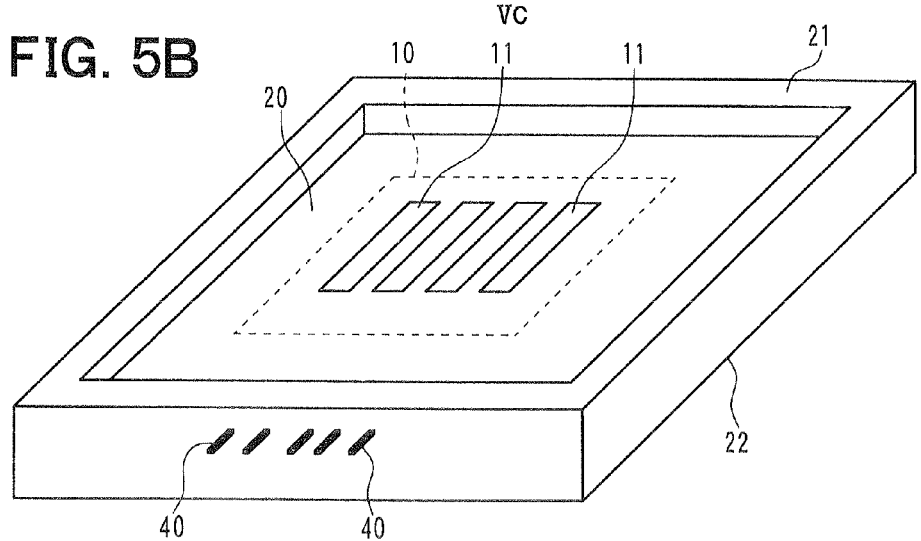
FIG. 5B is a diagram illustrating a perspective view of the semiconductor package of FIG. 5A.
Figure 5C:
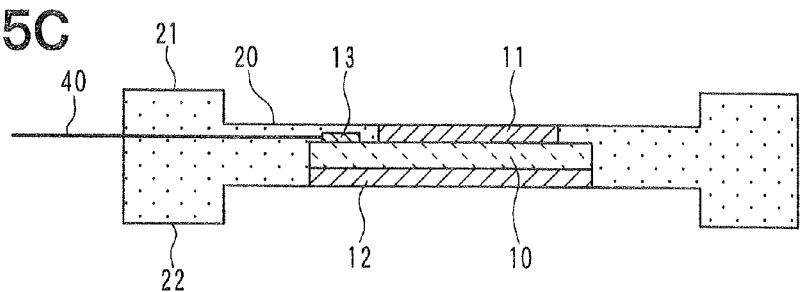
FIG. 5C is a diagram illustrating a cross-sectional view taken along the line VC-VC in FIG. 5A.

A semiconductor device according to a third embodiment of the present is described below with reference to FIGS. 5A-5C, 6A, and 6B. FIG. 5A is a plan view of a semiconductor package of the semiconductor device viewed from a front surface side of a semiconductor element 10 packaged in the semiconductor package. FIG. 5B is a perspective view of the semiconductor package viewed from the front surface side of the semiconductor element 10. FIG. 5C is a cross-sectional view taken along the line VC-VC in FIG. 5A.

Figure 6A:
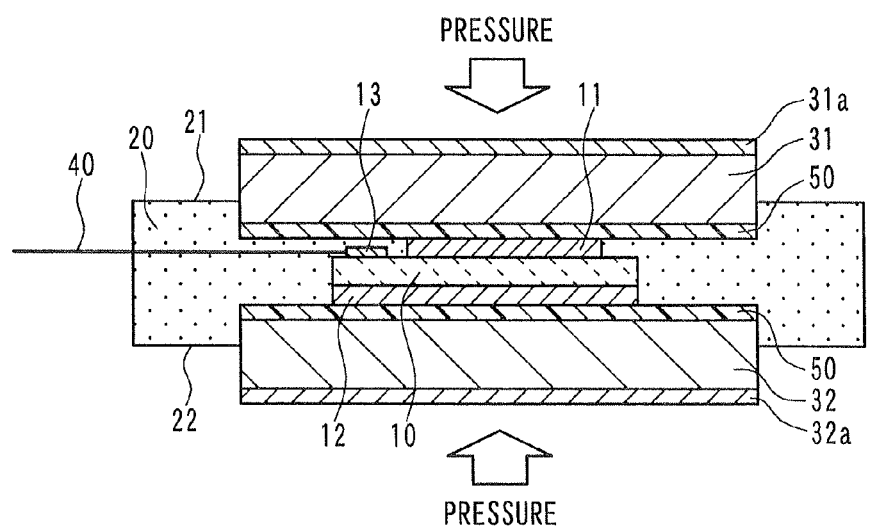
FIG. 6A is a diagram illustrating a cross-sectional view of the semiconductor device according to the third embodiment.
Figure 6B:
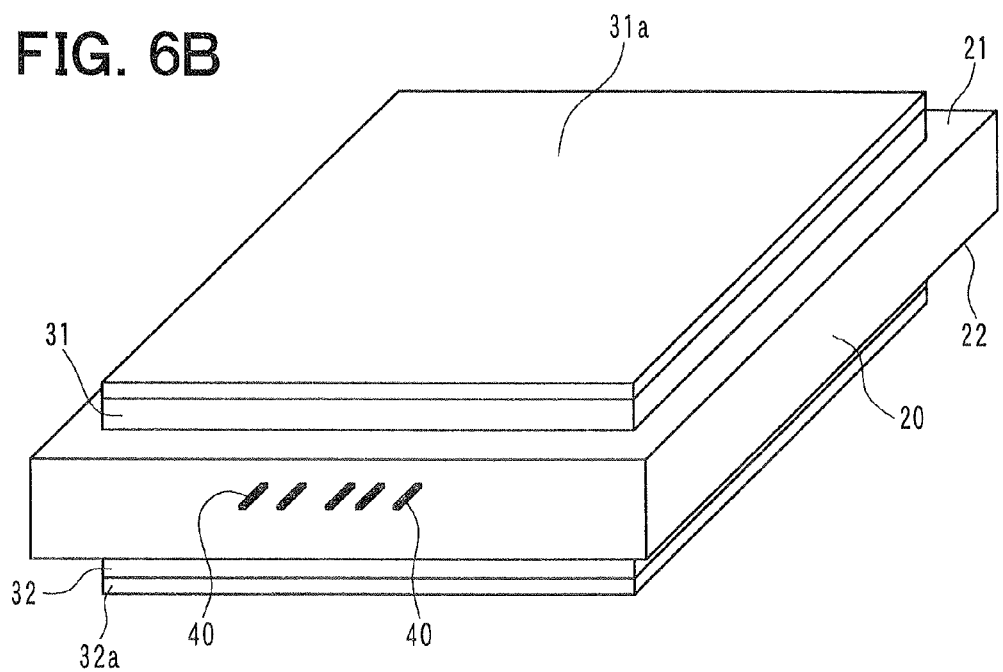
FIG. 6B is a diagram illustrating a perspective view of the semiconductor device of FIG. 6A.

FIG. 6A illustrates a cross-sectional exploded view of the semiconductor device according to the third embodiment FIG. 6B illustrates a cross-sectional view of the semiconductor device as an assembled product. A difference between the second embodiment and the third embodiment is as follows.

As shown in FIGS. 5A-5C, 6A and 6B, according to the third embodiment, the resin member 20 has a first wall portion 21 and a second wall portion 22. The first wall portion 21 stands on an outer region of the resin member 20 to define a first enclosed space where the front-surface electrode 11 is exposed. The second wall portion 22 stands on the outer region of the resin member 20 to define a second enclosed space where the back-surface electrode 12 is exposed.

After the first heatsink 31 is assembled with the semiconductor package, the first wall portion 21 of the resin member 20 is located outside the outer edge of the first heatsink 31 and extends along a side surface of the first heatsink 31. Thus the side surface of the first heatsink 31 is in contact with an inner surface of the first wall portion 21 and covered with the first wall portion 21. After the second heatsink 32 is assembled with the semiconductor package, the second wall portion 22 of the resin member 20 is located outside the outer edge of the second heatsink 32 and extends along a side surface of the second heatsink 32. Thus, the side surface of the second heatsink 32 is in contact with an inner surface of the second wall portion 22 and covered with the second wall portion 22.

A shape of an inner perimeter of the first wall portion 21 corresponds to a shape of an outer perimeter of the first heatsink 31 so that the first heatsink 31 can be fitted into the first enclosed space defined by the first wall portion 21. Specifically, the first wall portion 21 has a rectangular ring shape and stands on the outer region of the resin member 20. The first wall portion 21 has a predetermined height large enough to cover at least part of the side surface of the first heatsink 31 on the semiconductor device-side. Alternatively, the height of the first wall portion 21 can be large enough to cover the entire side surface of the first heatsink 31. A shape of an inner perimeter of the second wall portion 22 corresponds to a shape of an outer perimeter of the second heatsink 32 so that the second heatsink 32 can be fitted into the second enclosed space defined by the second wall portion 22. Specifically, the second wall portion 22 has a rectangular ring shape and stands on the outer region of the resin member 20. The second wall portion 22 has a predetermined height large enough to cover at least part of the side surface of the second heatsink 32 on the semiconductor device-side. Alternatively, the height of the second wall portion 22 can be large enough to cover the entire side surface of the second heatsink 32. For example, the resin member 20 having the first wall portion 21 and the second wall portion 22 can be formed by using a metal mold.

As described above, according to the third embodiment, the resin member 20 has the first wall portion 21 for defining the first enclosed space where the first heatsink 31 is placed and the second wall portion 22 for defining the second enclosed space where the second heatsink 32 is placed. Therefore, the semiconductor package, the first heatsink 31, and the second heatsink 32 can be easily and accurately assembled into the semiconductor device by fitting the first heatsink 31 and the second heatsink 32 into the first enclosed space and the second enclosed space, respectively. Further, since the first wall portion 21 and the second wall portion 22 extend along the side surfaces of the first heatsink 31 and the second heatsink 32, the creepage distance between the first heatsink 31 and the second heatsink 32 can be increased.

Further, according to the third embodiment the first wall portion 21 and the second wall portion 22 have the predetermined height. Therefore, for example, when the semiconductor package is placed on a workbench with the back surface of the semiconductor element 10 facing the workbench during assembly of the semiconductor device, the back-surface electrode 12 of the semiconductor can be spaced from the workbench by the second wall portion 22. Thus, the semiconductor element 10 can be prevented from damage during assembly of the semiconductor device.

In the example shown in FIGS. 5A-5C, 6A, and 6B, each of the first and second wall portions 21 and 22 has a rectangular ring shape and stands on the outer region of the resin member 20. That is, each of the first and second wall portions 21 and 22 has a continuous shape. The shapes of the first and second wall portions 21 and 22 are not limited to such a continuous ring shape. For example, each of the first and second wall portions 21 can include separate L-shaped walls arranged at corners of the rectangular resin member 20. Alternatively, each of the first and second wall portions 21 can include separate straight walls arranged on sides of the rectangular resin member 20.

Fourth Embodiment

Figure 7A:
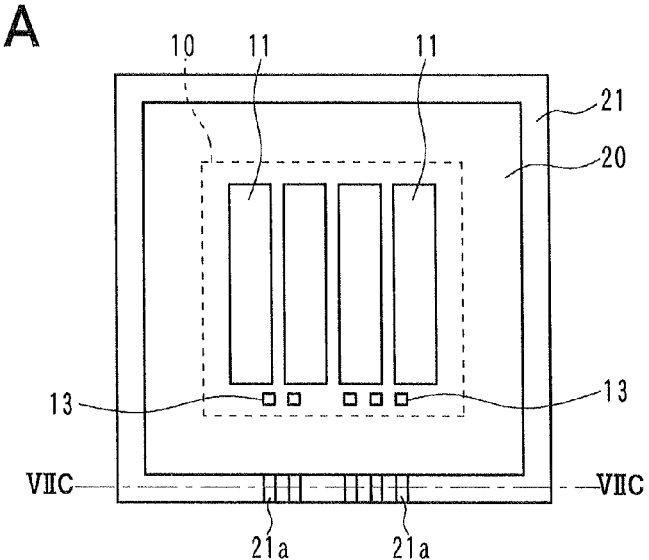
FIG. 7A is a diagram illustrating a plan view of a semiconductor package of a semiconductor device according to a fourth embodiment of the present invention.
Figure 7B:
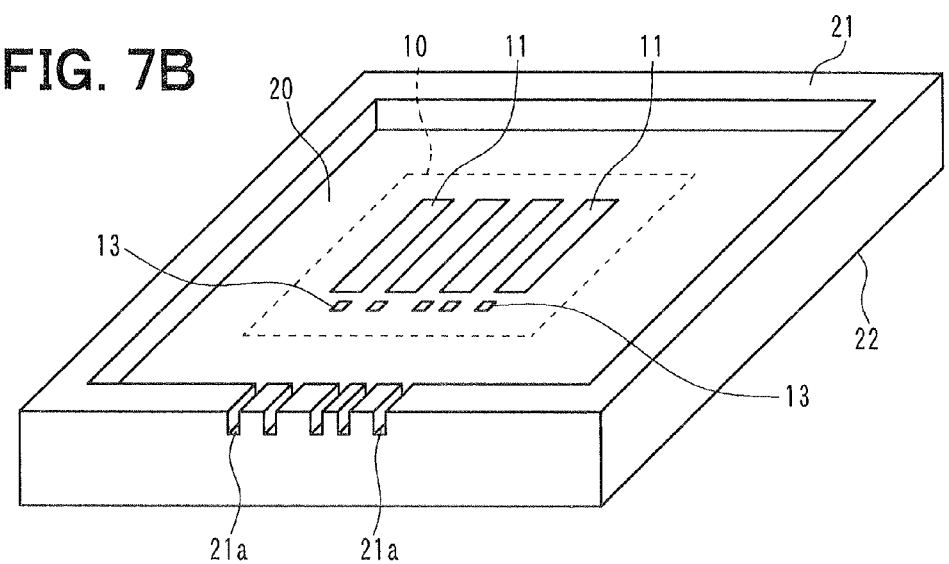
FIG. 7B is a diagram illustrating a perspective view of the semiconductor package of FIG. 7A.
Figure 7C:
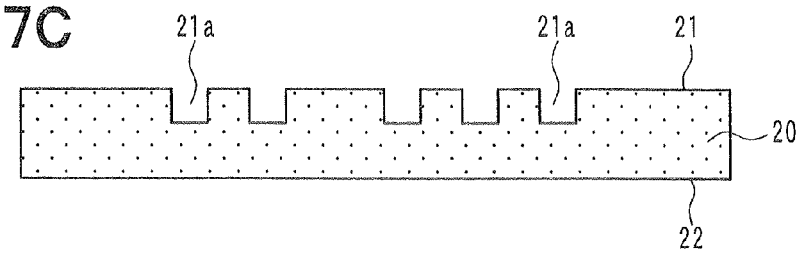
FIG. 7C is a diagram illustrating a cross-sectional view taken along the line VIIC-VIIC in FIG. 7A.

A semiconductor device according to a fourth embodiment of the present is described below with reference to FIGS. 7A-7C, 8A, and 8B. FIG. 7A is a plan view of a semiconductor package of the semiconductor device viewed from a front surface side of a semiconductor element 10 packaged in the semiconductor package. FIG. 7B is a perspective view of the semiconductor package viewed from the front surface side of the semiconductor element 10. FIG. 7C is a cross-sectional view taken along the line VIIC-VIIC in FIG. 7A.

Figure 8A:
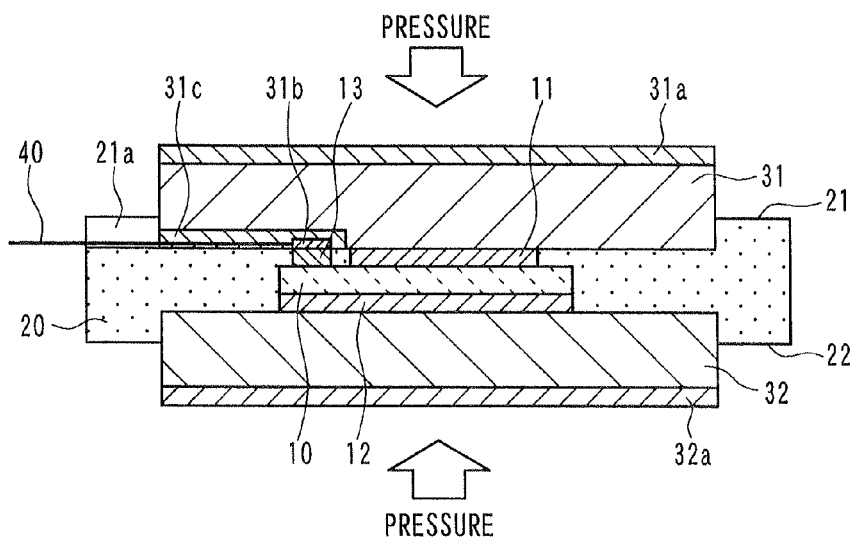
FIG. 8A is a diagram illustrating a cross-sectional view of the semiconductor device according to the fourth embodiment.
Figure 8B:
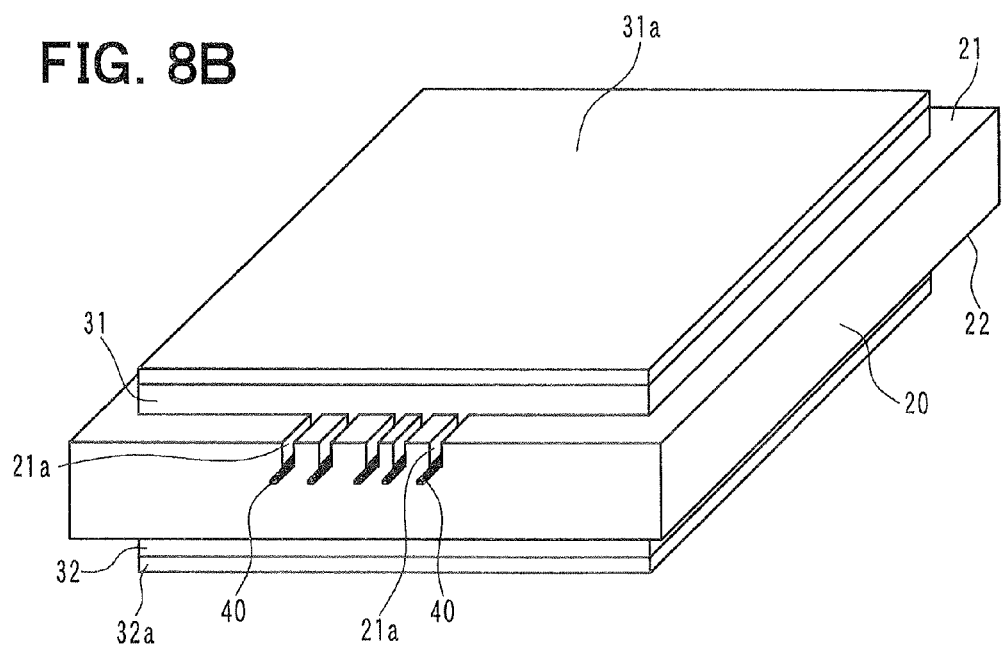
FIG. 8B is a diagram illustrating a perspective view of the semiconductor device of FIG. 8A.

FIG. 8A illustrates a cross-sectional exploded view of the semiconductor device according to the fourth embodiment. FIG. 8B illustrates a cross-sectional view of the semiconductor device as an assembled product. The fourth embodiment corresponds to a combination of the first embodiment and the third embodiment. A difference between the third embodiment and the fourth embodiment is as follows.

According to the third embodiment, the lead terminal 40 is provided to the semiconductor element 10. In contrast, according to the fourth embodiment, the lead terminal 40 is provided to the first heatsink 31. The lead terminal 40 extends in a planer direction of the first heatsink 31 over the outer edge of the first heatsink 31.

The first wall portion 21 of the resin member 20 has a slit 21a at a position corresponding to the lead terminal 40. When the first heatsink 31 is assembled with the semiconductor package, the lead terminal 40 is received by the slit 21a so that interference between the lead terminal 40 and the first wall portion 21 can be prevented.

In this way, the fourth embodiment can have the same advantages as the first embodiment and the third embodiment.

Fifth Embodiment

Figure 9A:
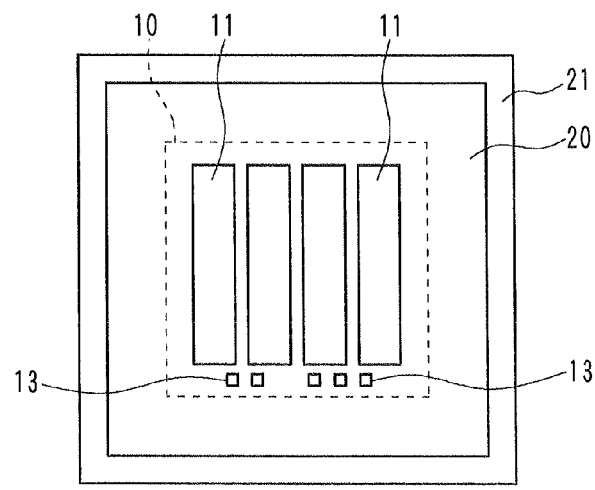
FIG. 9A is a diagram illustrating a plan view of a semiconductor package of a semiconductor device according to a fifth embodiment of the present invention.
Figure 9B:
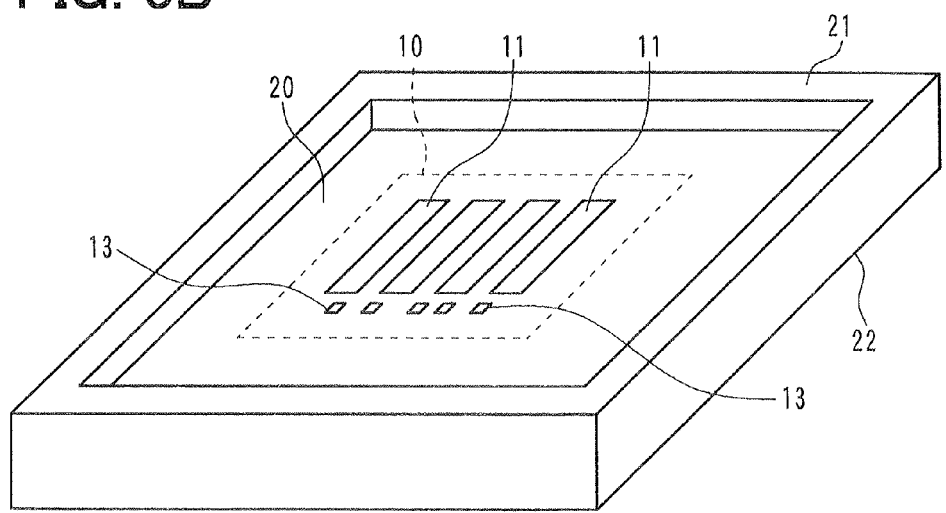
FIG. 9B is a diagram illustrating a perspective view of the semiconductor package of FIG. 9A.

A semiconductor device according to a fifth embodiment of the present is described below with reference to FIGS. 9A, 9B, 10A, and 10B. FIG. 9A is a plan view of a semiconductor package of the semiconductor device viewed from a front surface side of a semiconductor element 10 packaged in the semiconductor package. FIG. 9B is a perspective view of the semiconductor package viewed from the front surface side of the semiconductor element 10.

Figure 10A:
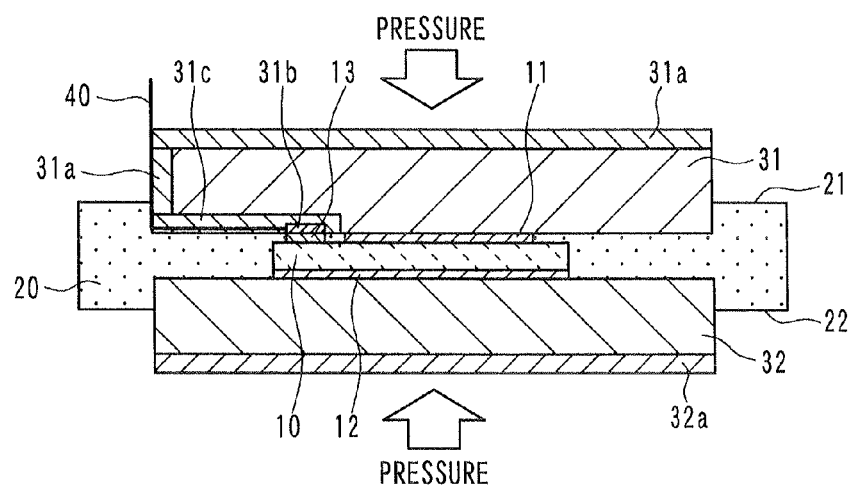
FIG. 10A is a diagram illustrating a cross-sectional view of the semiconductor device according to the fifth embodiment.
Figure 10B:
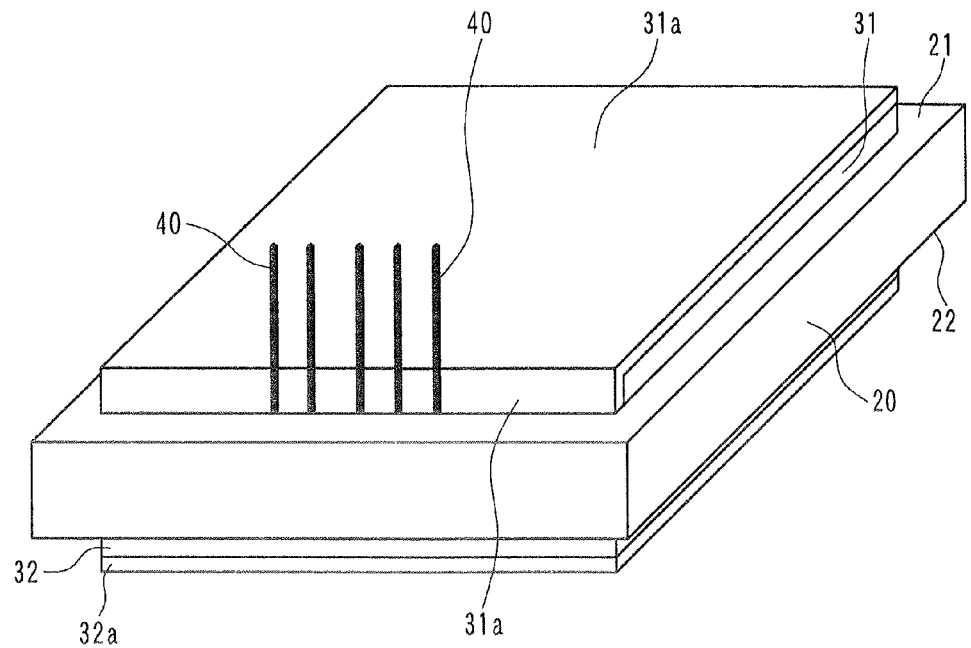
FIG. 10B is a diagram illustrating a perspective view of the semiconductor device of FIG. 10A.

FIG. 10A is a cross-sectional view of the semiconductor device according to the fifth embodiment. FIG. 10B is a perspective view of the semiconductor device of FIG. 10A. A difference between the fourth embodiment and the fifth embodiment is as follows.

Like the fourth embodiment, the lead terminal 40 is provided to the first heatsink 31. Unlike the fourth embodiment, the lead terminal 40 is bent along the side surface of the first heatsink 31. In such an approach, the interference between the lead terminal 40 and the first wall portion 21 can be prevented without forming the slit 21a in the first wall portion 21.

It is noted that the first electrically insulating film 31a is provided on not only the cooling surface but also the side surface of the first heatsink 31 to electrically insulate the lead terminal 40 from the side surface of the first heatsink 31. In such an approach, as shown in FIG. 10B, the lead terminal 40 can be pulled out from the cooling surface-side of the first heatsink 31.

Sixth Embodiment

Figure 11A:
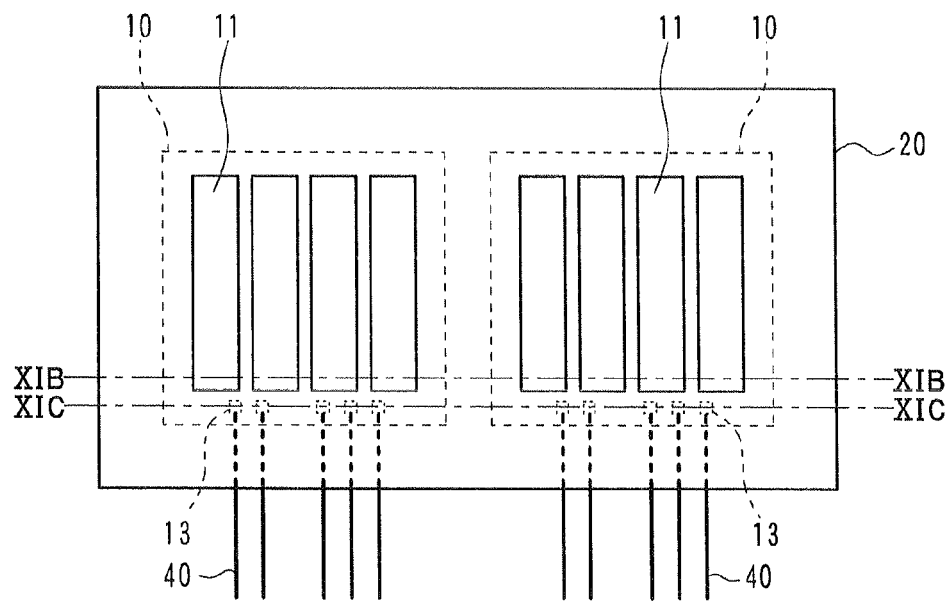
FIG. 11A is a diagram illustrating a plan view of a semiconductor package of a semiconductor device according to a sixth embodiment of the present invention.
Figure 11B:
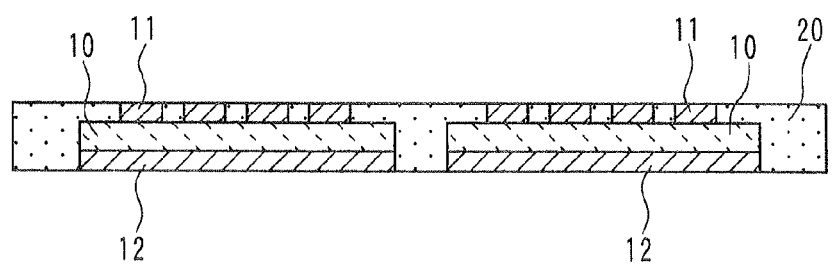
FIG. 11B is a diagram illustrating a cross-sectional view taken along the line XIB-XIB in FIG. 11A.
Figure 11C:
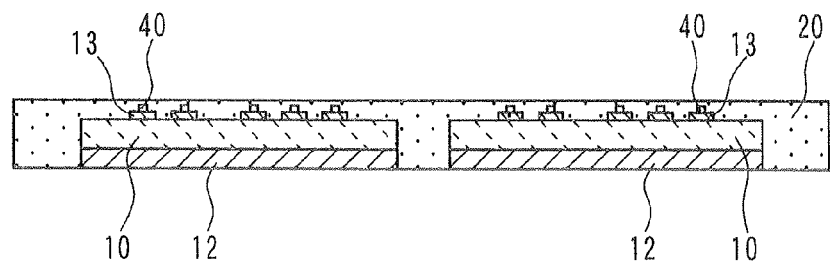
FIG. 11C is a diagram illustrating a cross-sectional view taken along the line XIC-XIC in FIG. 11A.

A semiconductor device according to a sixth embodiment of the present is described below with reference to FIG. 11A-11C. FIG. 11A is a plan view of a semiconductor package of the semiconductor device viewed from a front surface side of a semiconductor element 10 packaged in the semiconductor package. FIG. 11B is a cross-sectional view taken along the line XIB-XIB in FIG. 11A. FIG. 11C is a cross-sectional view taken along the line XIC-XIC in FIG. 11A.

According to the sixth embodiment, at least two semiconductor elements 10 are arranged so that a side surface of one semiconductor element 10 can face a side surface of the other semiconductor element 10. The arranged semiconductor elements 10 are encapsulated and sealed in a single resin member 20 in the same manner as the second embodiment. Thus, the semiconductor elements 10 are packaged together in the common resin member 20. In each semiconductor element 10, whereas the front-surface electrode 11 and the back-surface electrode 12 are exposed to the outer surface of the resin member 20, the lead terminal electrode pad 13 and the lead terminal 40 connected to the lead terminal electrode pad 13 are encapsulated in the resin member 20.

In an example shown in FIGS. 11A-11C, the semiconductor elements 10 are arranged so that the lead terminals 40 can extend in the same direction. In such an approach, the semiconductor elements 10 can be easily connected in parallel. Alternatively, the semiconductor elements 10 can be arranged so that the lead terminals 40 can extend in different directions. In such an approach, the semiconductor device can be easily connected to external circuitry.

Seventh Embodiment

Figure 12A:
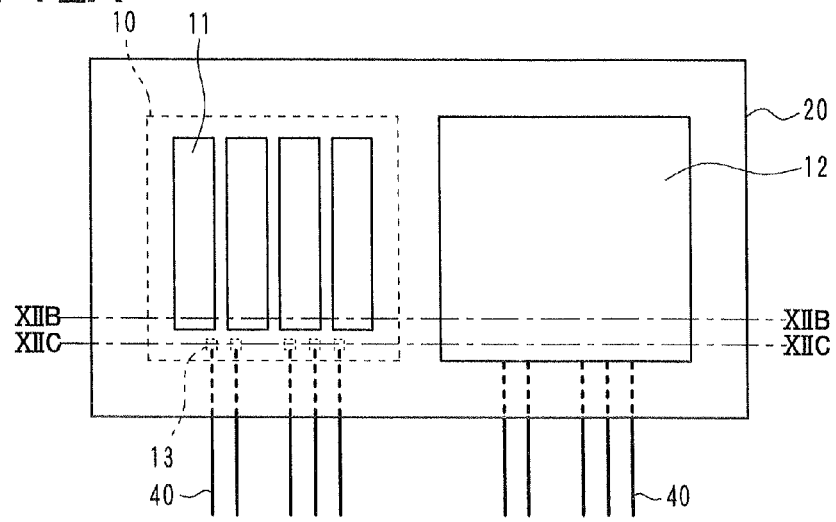
FIG. 12A is a diagram illustrating a plan view of a semiconductor package of a semiconductor device according to a seventh embodiment of the present invention.
Figure 12B:
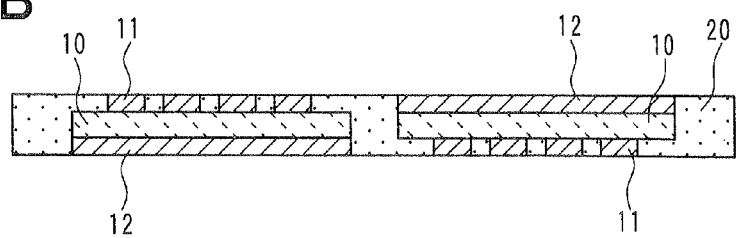
FIG. 12B is a diagram illustrating a cross-sectional view taken along the line XIIB-XIIB in FIG. 12A.
Figure 12C:
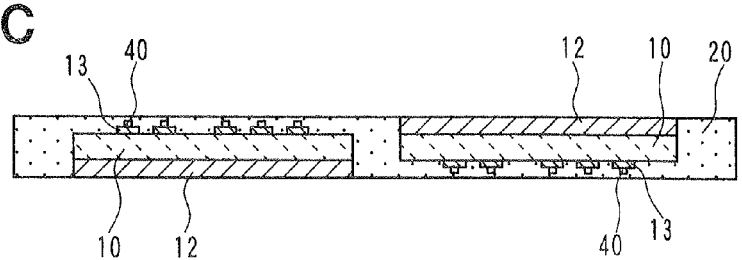
FIG. 12C is a diagram illustrating a cross-sectional view taken along the line XIIC-XIIC in FIG. 12A.
Figure 12D:
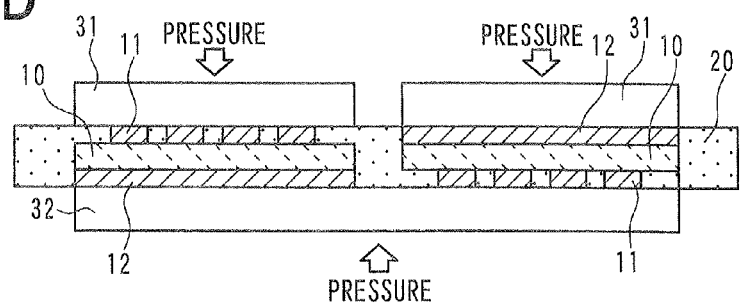
FIG. 12D is a diagram illustrating a cross-sectional view of the semiconductor device according to the seventh embodiment.

A semiconductor device according to a seventh embodiment of the present is described below with reference to FIG. 12A-12D. FIG. 12A is a plan view of a semiconductor package of the semiconductor device viewed from a front surface side of a semiconductor element 10 packaged in the semiconductor package. FIG. 12B is a cross-sectional view taken along the line XIIB-XIIB in FIG. 12A. FIG. 12C is a cross-sectional view taken along the line XIIC-XIIC in FIG. 12A. FIG. 12D is a cross-sectional view of the semiconductor device as an assemble product. A difference between the sixth embodiment and the seventh embodiment is as follows.

As shown in FIGS. 12A-12C, like the sixth embodiment, the semiconductor elements 10 are arranged so that a side surface of one semiconductor element 10 can face a side surface of the other semiconductor element 10. Unlike the sixth embodiment, the semiconductor elements 10 are arranged so that a front surface of one semiconductor element 10 and a front surface of the other semiconductor element 10 can face opposite directions. The arranged semiconductor elements 10 are encapsulated and sealed in a single resin member 20 in the same manner as the second embodiment. Thus, the semiconductor elements 10 are packaged together in the common resin member 20. In each semiconductor element 10, whereas the front-surface electrode 11 and the back-surface electrode 12 are exposed to the outer surface of the resin member 20, the lead terminal electrode pad 13 and one end of the lead terminal 40 connected to the lead terminal electrode pad 13 are encapsulated in the resin member 20.

In an example shown in FIGS. 12A-12C, the semiconductor elements 10 are arranged so that the lead terminals 40 can extend in the same direction. Alternatively, the semiconductor elements 10 can be arranged so that the lead terminals 40 can extend in different directions.

As mentioned previously, the semiconductor element 10 can be an IGBT. In this case, assuming that the semiconductor package and the first and second heatsinks 31 and 32 are assembled into the semiconductor device in a manner as shown in FIG. 12D, the semiconductor device can be configured as a 2-in-1 module for providing one arm of an inverter circuit.

Eighth Embodiment

Figure 13A:
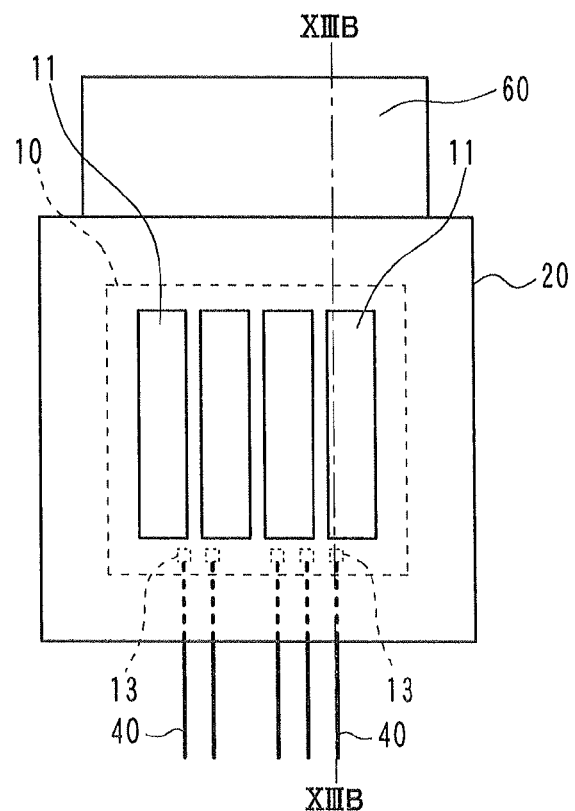
FIG. 13A is a diagram illustrating a plan view of a semiconductor package of a semiconductor device according to an eighth embodiment of the present invention.
Figure 13B:
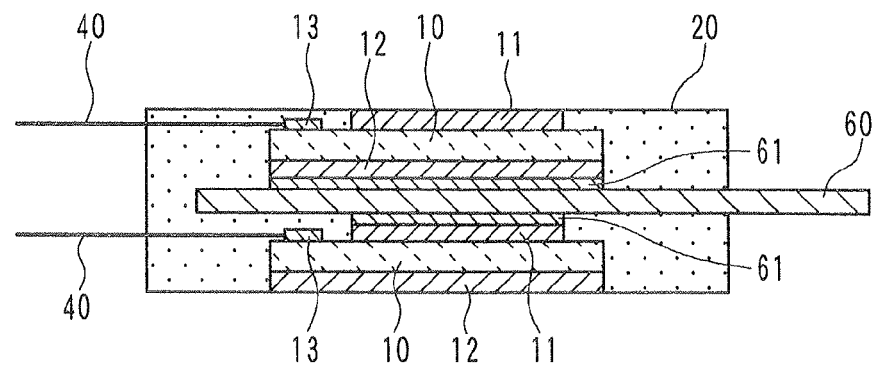
FIG. 13B is a diagram illustrating cross-sectional view taken along the line XIIIB-XIIIB in FIG. 13A.

A semiconductor device according to an eighth embodiment of the present is described below with reference to FIGS. 13A and 13B. FIG. 13A is a plan view of a semiconductor package of the semiconductor device viewed from a front surface side of a semiconductor element 10 packaged in the semiconductor package. FIG. 13B is a cross-sectional view taken along the line XIIIB-XIIIB in FIG. 13A.

As shown in FIGS. 13A and 13B, according to the eighth embodiment, two semiconductor elements 10 are arranged so that a front surface of one semiconductor element 10 can face a back surface of the other semiconductor element 10 through a plate-shaped lead member 60 made of metal such as cupper. The lead member 60 is joined to the semiconductor elements 10 by a joint member 61 such as solder.

In such an approach, the semiconductor device according to the eighth embodiment can be configured as a 2-in-1 module for providing one arm of an inverter circuit. The lead member 60 electrically connects a front-surface electrode 11 of one semiconductor element 10 and a back-surface electrode 12 of the other semiconductor element 10 so as to obtain a midpoint potential between the semiconductor elements 10. Further, the lead member 60 can serve as a heatsink.

Figure 14A:
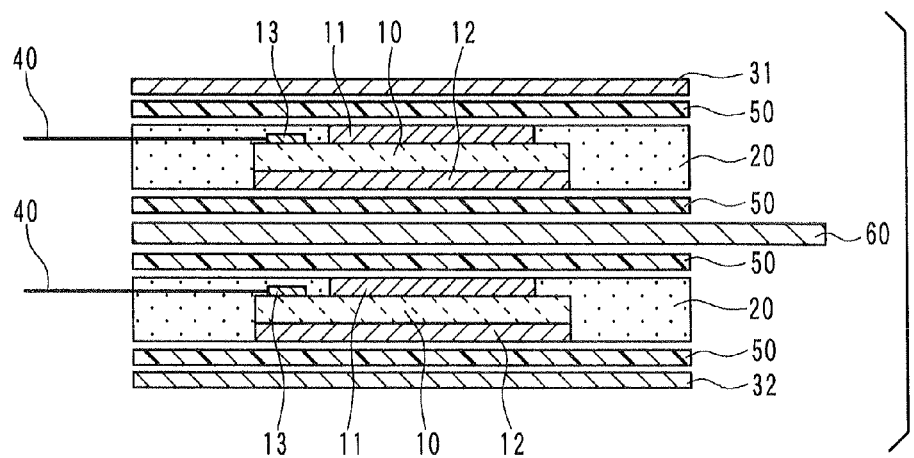
FIG. 14A is a diagram illustrating a cross-sectional exploded view of a semiconductor device according to a modification of the eighth embodiment.
Figure 14B:
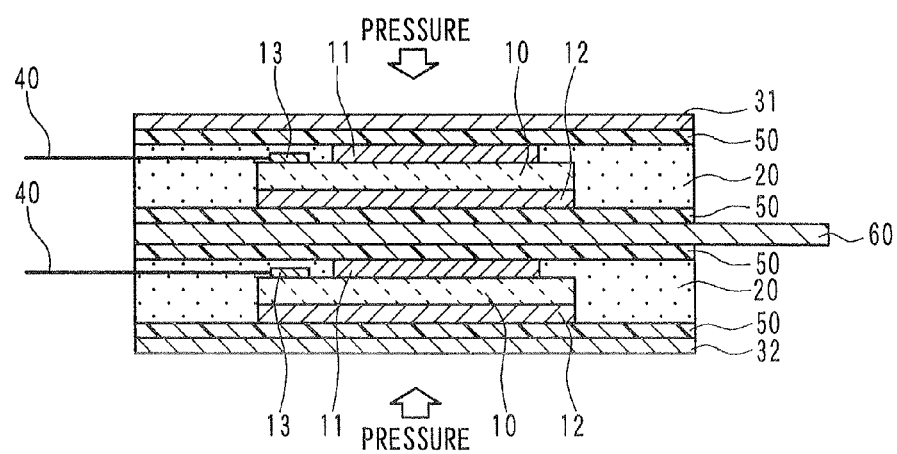
FIG. 14B is a diagram illustrating a cross-sectional view of the semiconductor device of FIG. 14A.

FIG. 14A is a cross-sectional exploded view of a semiconductor device according to a modification of the eighth embodiment, and FIG. 14B is a cross-sectional view of the semiconductor device of FIG. 14A.

When the semiconductor elements 10 are stacked one on top of another, the second heatsink 32, the semiconductor element 10 encapsulated in the resin member 20, the lead member 60, the semiconductor element 10 encapsulated in the resin member 20, and the first heatsink 31 can be stacked in this order and assembled into the semiconductor device by applying pressure to the first and second heatsinks 31 and 32 as shown in FIGS. 14A and 14B. It is noted that the interposer 50 shown in FIGS. 14A and 14B is optional and can be removed as necessary.

The semiconductor device shown FIGS. 14A and 14B can be configured as a 2-in-1 module for providing one arm of an inverter circuit. Since the semiconductor device shown in FIGS. 13A-14B has a chip scale package (CSP) structure, the thickness of the semiconductor device is reduced so that the size of the semiconductor device can be reduced.

Ninth Embodiment

Figure 15A:
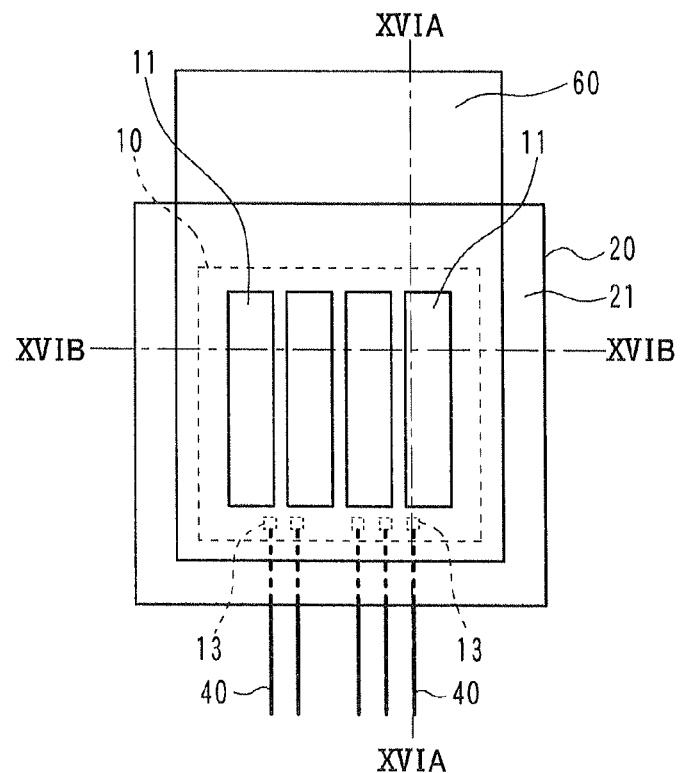
FIG. 15A is a diagram illustrating a plan view of a semiconductor package of a semiconductor device according to a ninth embodiment of the present invention.

A semiconductor device according to a ninth embodiment of the present invention is described below with reference to FIGS. 15A and 15B, and 16A and 16B. FIG. 15A is a plan view of a semiconductor package of the semiconductor device viewed from a front surface side of a semiconductor element 10 packaged in the semiconductor package. FIG.

15B is a perspective view of the semiconductor package of FIG. 15A. It is noted that the lead member 60 is omitted in FIG. 15B.

Figure 16A:
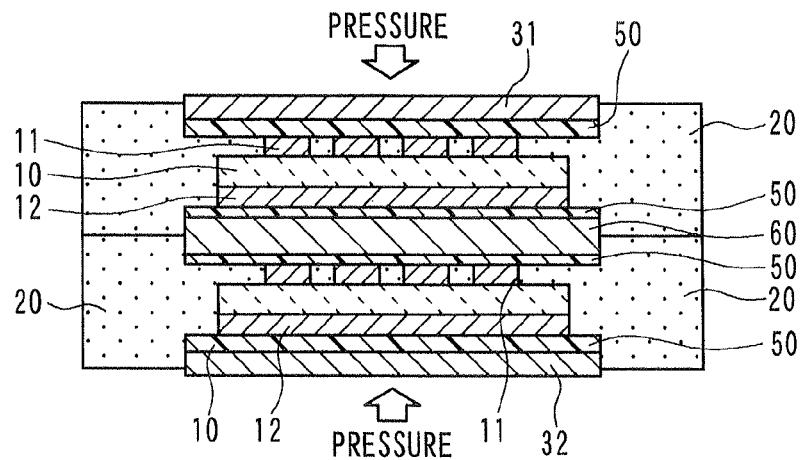
FIG. 16A is a diagram illustrating a cross-sectional view of the semiconductor device taken along the line XVIA-XVIA in FIG. 15A.
Figure 16B:
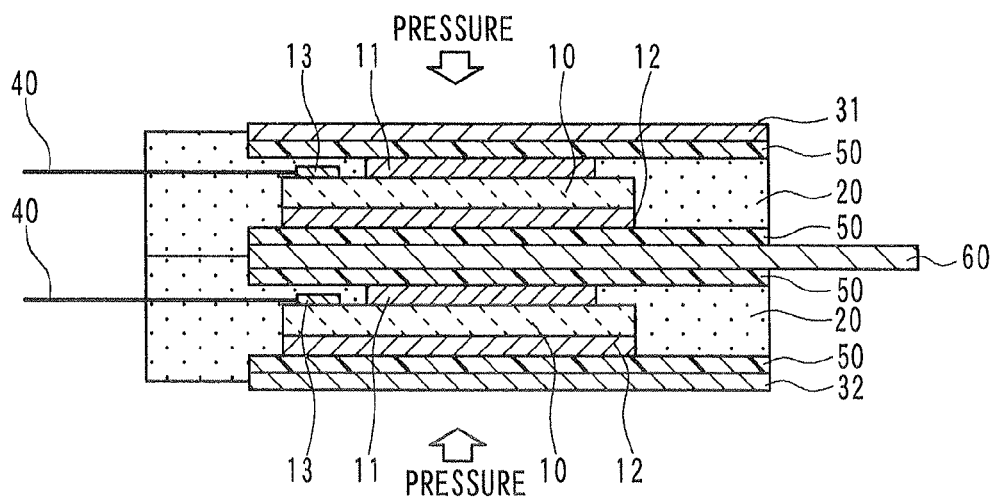
FIG. 16B is a diagram illustrating a cross-sectional view of the semiconductor device taken along the line XVIB-XVIB in FIG. 15A.

FIG. 16A is a cross-sectional view of the semiconductor device taken along the line XVIA-XVIA in FIG. 15A, and FIG. 16B is a cross-sectional view of the semiconductor device taken along the line XVIB-XVIB in FIG. 16A.

Figure 15B:
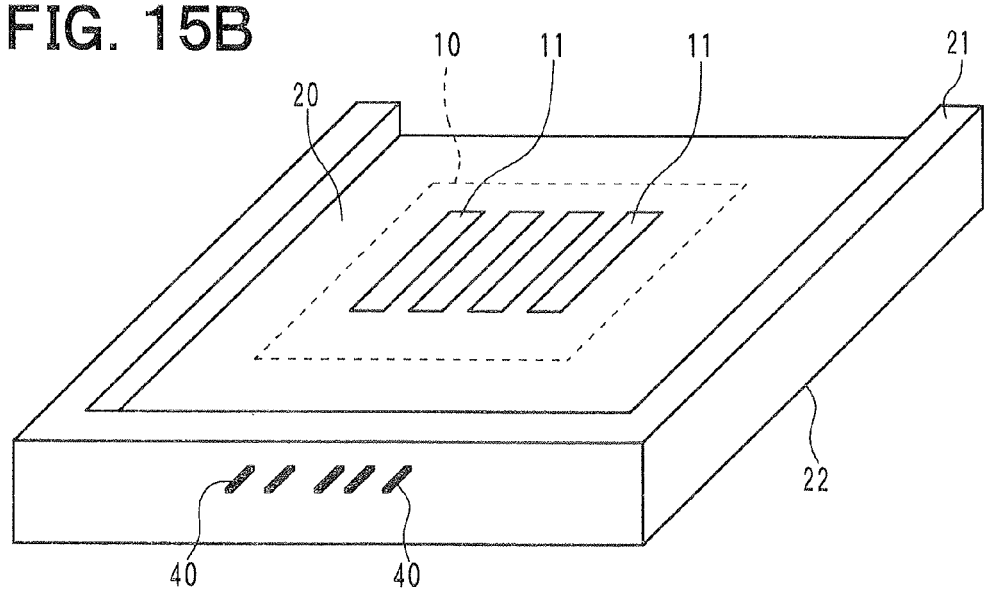
FIG. 15B is a diagram illustrating a perspective view of the semiconductor package of FIG. 15A.

The semiconductor shown in FIGS. 16A and 16B is manufactured by stacking two semiconductor packages shown in FIG. 15B through the lead member 60 and by attaching the first and second heatsinks 31 and 32 to the stacked semiconductor packages. Thus, the semiconductor device shown FIGS. 16A and 16B can be configured as a 2-in-1 module for providing one arm of an inverter circuit. Like the third embodiment, the resin member 20 has the first wall portion 21 and the second wall portion 22.

According to the ninth embodiment, the first and second wall portions 21 and 22 are removed at a position where the lead member 60 is located. For example, as shown in FIG. 15B, the first and second wall portions 21 and 22 can have a rectangular C-shape. Thus, the lead member 60 is fitted into a space defined by the first and second wall portions 21 and 22 so that the semiconductor packages and the lead member 60 can be easily and accurately assembled together.

Tenth Embodiment

Figure 17A:
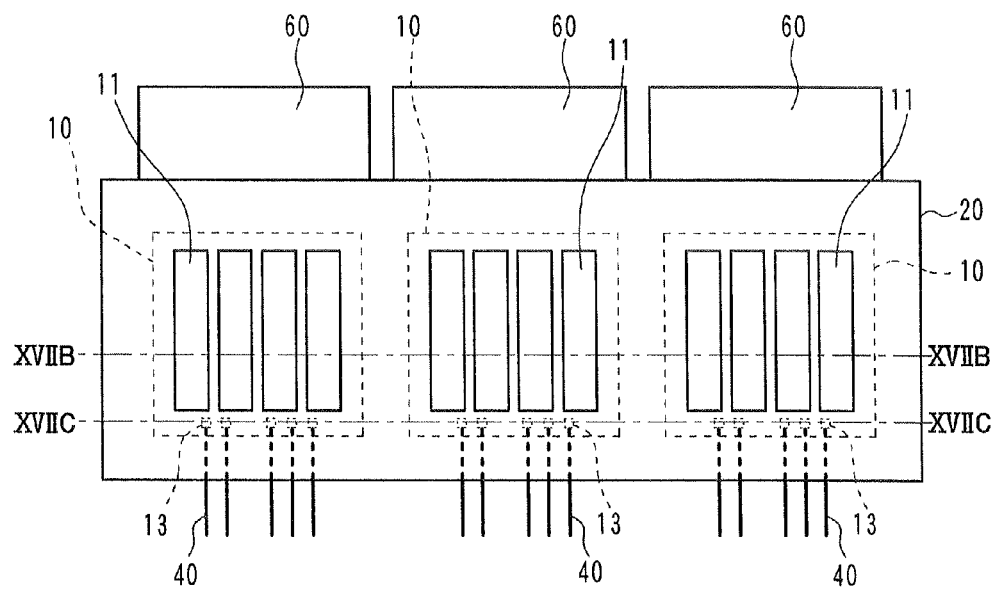
FIG. 17A is a diagram illustrating a plan view of a semiconductor package of a semiconductor device according to a tenth embodiment of the present invention.

A semiconductor device according to a tenth embodiment of the present invention is described below with reference to FIGS. 17A and 17B. FIG. 17A is a plan view of a semiconductor package of the semiconductor device, FIG. 17B is a cross-sectional view taken along the line XVIIB-XVIIB in FIG. 17A and FIG. 17C is a cross-sectional view taken along the line XVIIC-XVIIC in FIG. 17A.

Figure 17B:
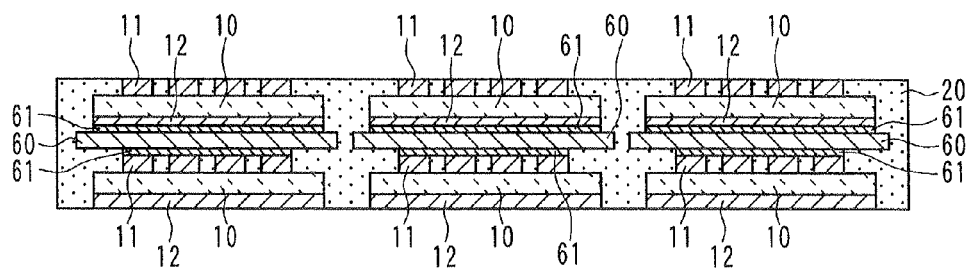
FIG. 17B is a diagram illustrating a cross-sectional view taken along the line XVIIB-XVIIB in FIG. 17A.
Figure 17C:
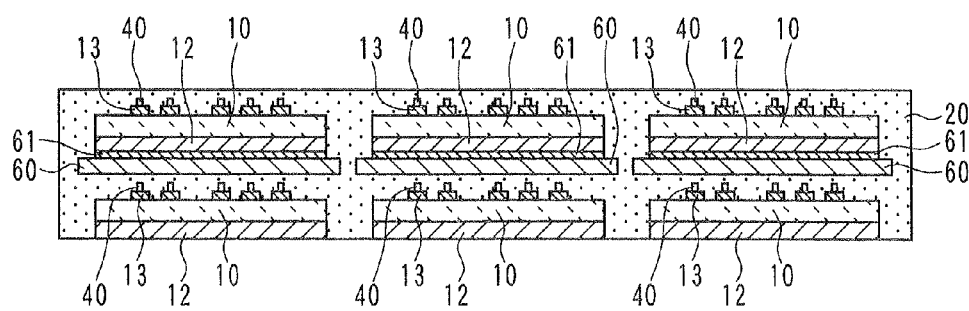
FIG. 17C is a diagram illustrating a cross-sectional view taken along the line XVIIC-XVIIC in FIG. 17A.

As can be seen from FIGS. 17A-17C, the semiconductor package of the tenth embodiment is manufactured by arranging three semiconductor packages shown in FIGS. 13A and 13B in parallel. Specifically, six semiconductor elements 10, each two of which are stacked through the lead member 60 by using the joint member 61 to provide one arm of an inverter circuit, are packaged together in a common resin member 20. Thus, the semiconductor package shown in FIGS. 17A-17C can be configured as a 6-in-1 module for providing all arms of a three-phase inverter circuit.

Eleventh Embodiment

Figure 18A:
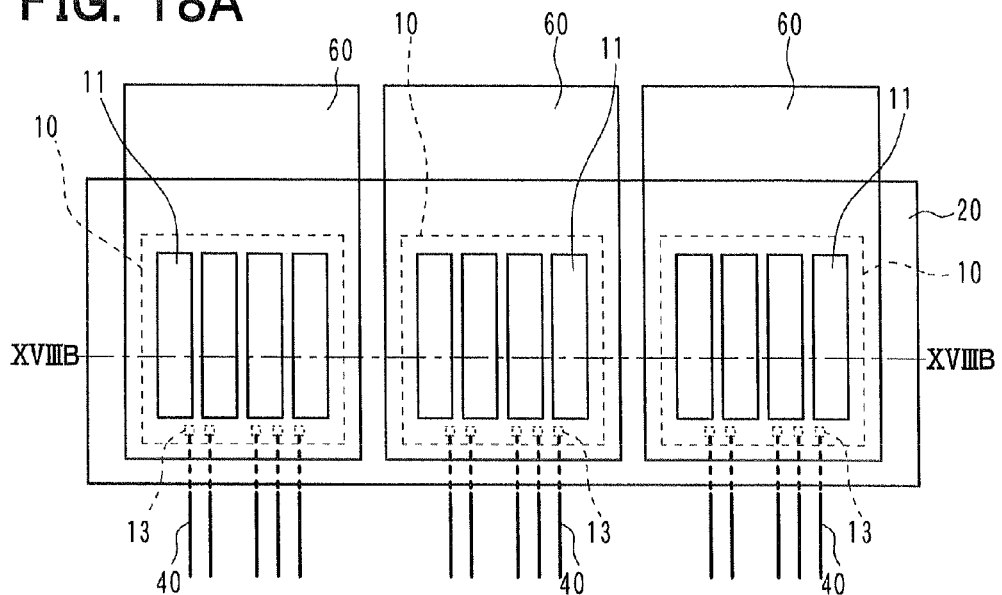
FIG. 18A is a diagram illustrating a plan view of a semiconductor package of a semiconductor device according to an eleventh embodiment of the present invention.

A semiconductor device according to an eleventh embodiment of the present invention is described below with reference to FIGS. 18A-18C. FIG. 18A is a plan view of a semiconductor package of the semiconductor device, FIG. 18B is a cross-sectional exploded view of the semiconductor device taken along the line XVIIIB-XVIIIB in FIG. 18A, and FIG. 18C is a cross-sectional view of the semiconductor device taken along the line XVIIIB-XVIIIB in FIG. 18A.

Figure 18B:
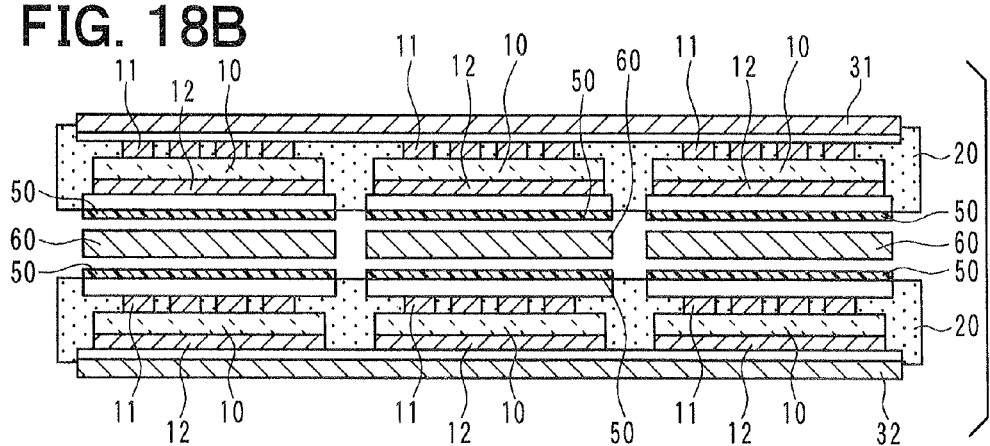
FIG. 18B is a diagram illustrating a cross-sectional exploded view of the semiconductor device taken along the line XVIIIB-XVIIIB in FIG. 18A.
Figure 18C:
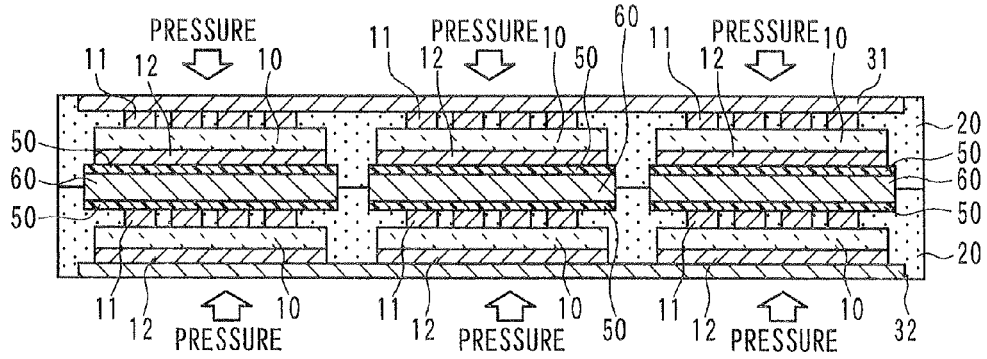
FIG. 18C is a diagram illustrating a cross-sectional view of the semiconductor device taken along the line XVIIIB-XVIIIB in FIG. 18A.

As can be seen from FIGS. 18A-18C, the semiconductor package of the eleventh embodiment is manufactured by arranging three semiconductor packages shown in FIGS. 14A and 14B in parallel. Specifically, six semiconductor elements 10, each two of which are stacked through the lead member 60 without using the joint member 61 to provide one arm of an inverter circuit, are packaged together in a common resin member 20. Thus, the semiconductor package shown in FIGS. 18A-18C can be configured as a 6-in-1 module for providing all arms of a three-phase inverter circuit.

Twelfth Embodiment

Figure 19:
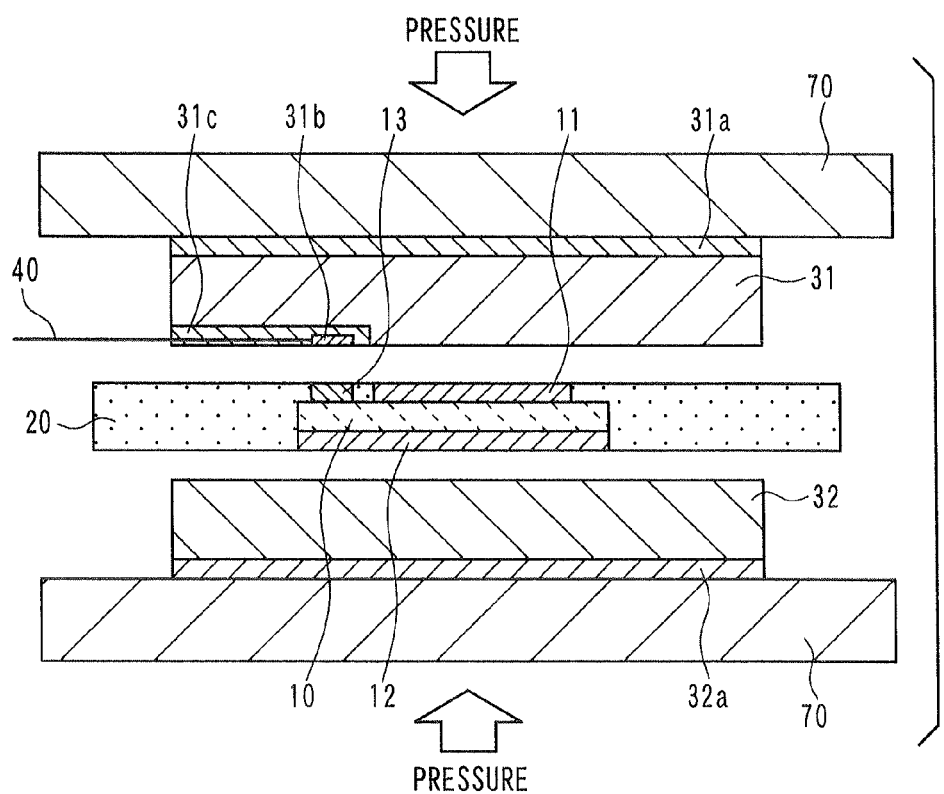
FIG. 19 is a diagram illustrating an exploded cross-sectional view of a semiconductor device according to a twelfth embodiment of the present invention.

A semiconductor device according to a twelfth embodiment of the present is described below with reference to FIG. 19. FIG. 19 is an exploded cross-sectional view of the semiconductor device. Like the preceding embodiments, the semiconductor element 10 is sealed in the resin member 20 to form the semiconductor package, and the semiconductor package and the first and second heatsinks 31 and 32 are assembled into the semiconductor device in such a manner that the front-surface electrode 11 and the back-surface electrode 12 of the semiconductor element 10 are in direct contact with the first heatsink 31 and the second heatsink 32 under pressure from the first heatsink 31 and the second heatsink 32.

Further, according to the twelfth embodiment, a cooling member 70 is attached to the cooling surface of the first heatsink 31 through the electrically insulating film 31a. Likewise, another cooling member 70 is attached to the cooling surface of the second heatsink 32 through the electrically insulating film 32a. In this case, the semiconductor package and the first and second heatsinks 31 and 32 can be assembled into the semiconductor device by applying pressure to the cooling members 70.

In an example shown in FIG. 19, like the first embodiment the lead terminal 40 is provided to the first heatsink 31. Alternatively, like the second embodiment, the lead terminal 40 can be provided to the semiconductor element 10.

Thirteenth Embodiment

A method of manufacturing a semiconductor device according to a thirteenth embodiment of the present invention is described below with reference to FIGS. 20A and 20B. For example, the method shown in FIGS. 20A and 20B can be used for manufacturing the semiconductor device of the first embodiment. Firstly, as shown in FIG. 20A, the semiconductor element 10 including the front-surface electrode 11, the back-surface electrode 12 and the lead terminal electrode pad 13 are encapsulated in the resin member 20, for example, by using a metal mold, potting, or the like.

Then, the resin member 20 is polished or cut, for example, by using a cutting tool K1 until the front-surface electrode 11, the back-surface electrode 12, and the lead terminal electrode pad 13 are exposed to the outer surface of the resin member 20. Thus the semiconductor package shown in FIG. 20B can be manufactured.

Figure 20A:
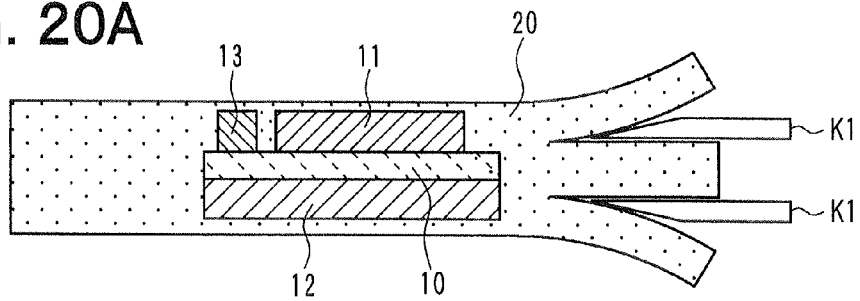
FIG. 20A is a diagram illustrating a method of manufacturing a semiconductor package of a semiconductor device according to a thirteenth embodiment of the present invention and FIG. 20B is a diagram illustrating the semiconductor package manufactured by the method shown in FIG. 20A.
Figure 20B:
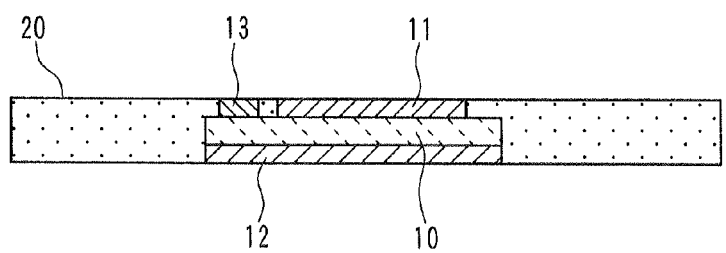

In an example shown in FIGS. 20A and 20B, the initial thicknesses of the front-surface electrode 11, the back-surface electrode 12, and the lead terminal electrode pad 13 are large so that the front-surface electrode 11, the back-surface electrode 12, and the lead terminal electrode pad 13 can be exposed to the outer surface of the resin member 20 by cutting the front-surface electrode 11, the back-surface electrode 12, and the lead terminal electrode pad 13 while cutting the resin member 20. In such an approach, the front-surface electrode 11, the back-surface electrode 12, and the lead terminal electrode pad 13 can be easily and surely exposed to the outer surface of the resin member 20.

Figure 21A:
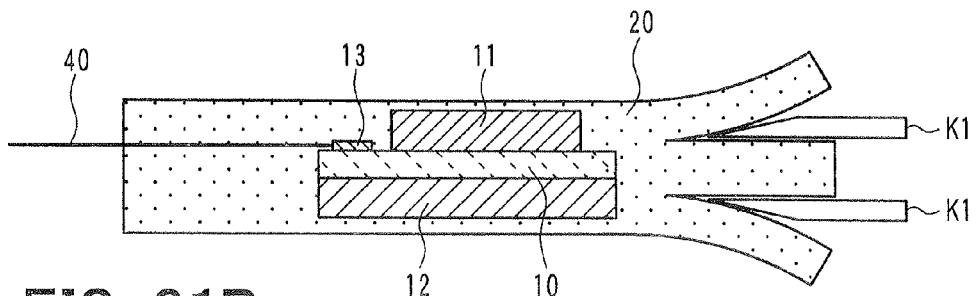
FIG. 21A is a diagram illustrating a method of manufacturing a semiconductor package of a semiconductor device according to a modification of the thirteenth embodiment.
Figure 21B:
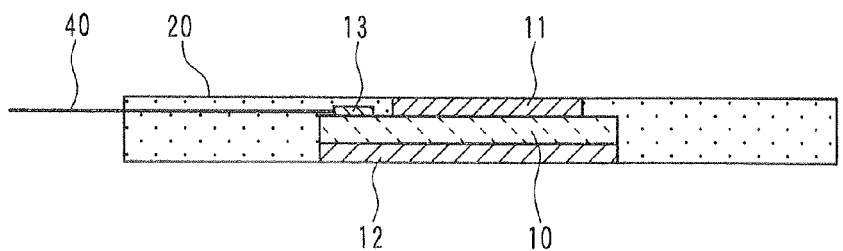
FIG. 21B is a diagram illustrating the semiconductor package manufactured by the method shown in FIG. 21A.

A method of manufacturing a semiconductor device according to a modification of the thirteenth embodiment is described below with reference to FIGS. 21A and 21B. For example, the method shown in FIGS. 21A and 21B can be used for manufacturing the semiconductor device of the second embodiment. Firstly, as shown in FIG. 20A, the semiconductor element 10 including the front-surface electrode 11, the back-surface electrode 12, the lead terminal electrode pad 13, and the lead terminal 40 joined to the lead terminal electrode pad 13 are encapsulated in the resin member 20, for example, by using a metal mold, potting or the like. It is noted that the initial thickness of the lead terminal electrode pad 13 is set less than the front-surface electrode 11.

Then, the resin member 20 is polished or cut, for example, by using a cutting tool K1 until only the front-surface electrode 11 and the back-surface electrode 12 are exposed to the outer surface of the resin member 20. Thus, the semiconductor package shown in FIG. 21B can be manufactured.

Fourteenth Embodiment

Figure 22A:
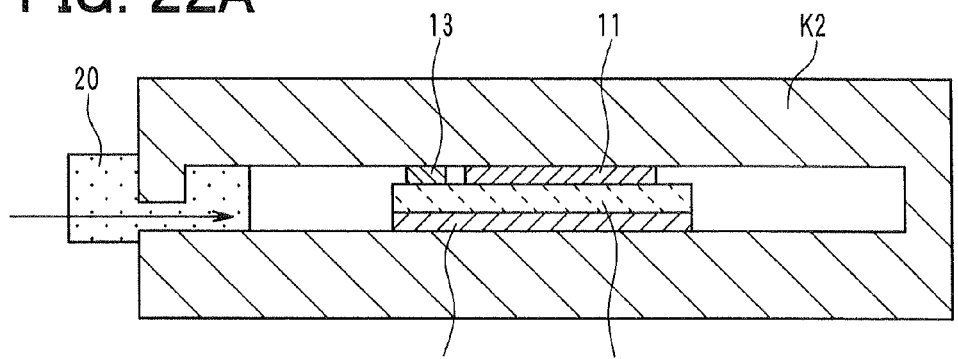
FIG. 22A is a diagram illustrating a method of manufacturing a semiconductor package of a semiconductor device according to a fourteenth embodiment of the present invention.

A method of manufacturing a semiconductor device according to a fourteenth embodiment of the present invention is described below with reference to FIGS. 22A and 22B. For example, the method shown in FIGS. 22A and 22B can be used for manufacturing the semiconductor device of the first embodiment. Firstly, as shown in FIG. 22A, the semiconductor element 10 is placed in a metal mold K2 in such a manner that the front-surface electrode 11 the back-surface electrode 12, and the lead terminal electrode pad 13 are in close contact with an inner surface of the metal mold K2. Then, a resin material is injected into the metal mold K2 from an opening of the metal mold K2 to fill the metal mold K2.

Figure 22B:
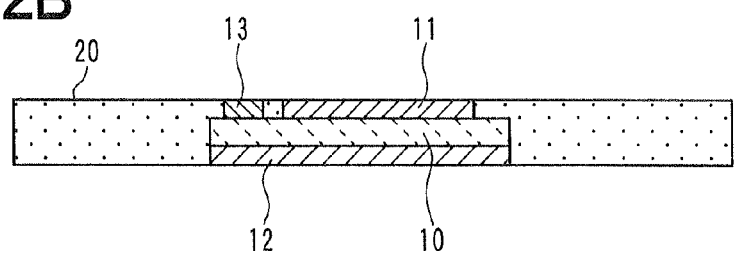
FIG. 22B is a diagram illustrating the semiconductor package manufactured by the method shown in FIG. 22A.

Thus, as shown in FIG. 22B, the semiconductor element 10 is encapsulated in the resin member 20 in such a manner that the front-surface electrode 11, the back-surface electrode 12, and the lead terminal electrode pad 13 are exposed to the outer surface of the resin member 20.

Figure 23A:
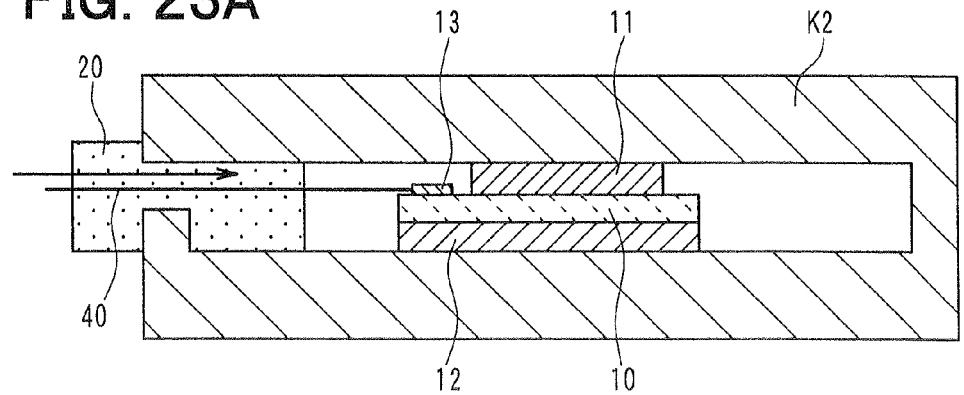
FIG. 23A is a diagram illustrating a method of manufacturing a semiconductor package of a semiconductor device according to a modification of the fourteenth embodiment.
Figure 23B:
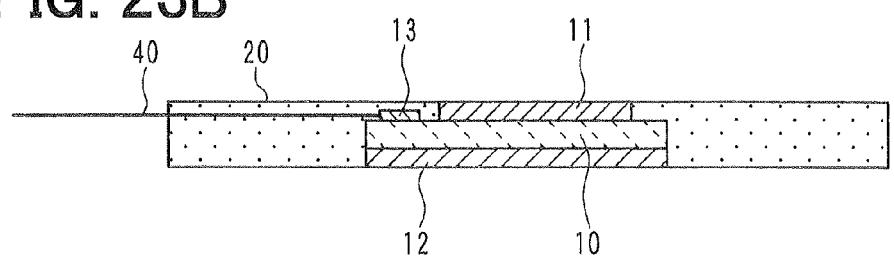
FIG. 23B is a diagram illustrating the semiconductor package manufactured by the method shown in FIG. 23A.

A method of manufacturing a semiconductor device according to a modification of the fourteenth embodiment is described below with reference to FIGS. 23A and 23B. For example, the method shown in FIGS. 23A and 23B can be used for manufacturing the semiconductor device of the second embodiment. Firstly, as shown in FIG. 23A, the semiconductor element 10 is placed in a metal mold K2 in such a manner that the front-surface electrode 11 and the back-surface electrode 12 are in close contact with an inner surface of the metal mold K2 and that the lead terminal 40 connected to the lead terminal electrode pad 13 extends through an opening of the metal mold K2. It is noted that the thickness of the lead terminal electrode pad 13 is set less than the front-surface electrode 11 so that the lead terminal electrode pad 13 can be spaced from the inner surface of the metal mold K2. Then, a resin material is injected into the metal mold K2 from the opening of the metal mold K2 to fill the metal mold K2.

Thus, as shown in FIG. 22B, the semiconductor element 10 is encapsulated in the resin member 20 in such a manner that the front-surface electrode 11 and the back-surface electrode 12 are exposed to the outer surface of the resin member 20 and that the lead terminal electrode pad 13 is encapsulated in the resin member 20.

Fifteenth Embodiment

Figure 24A:
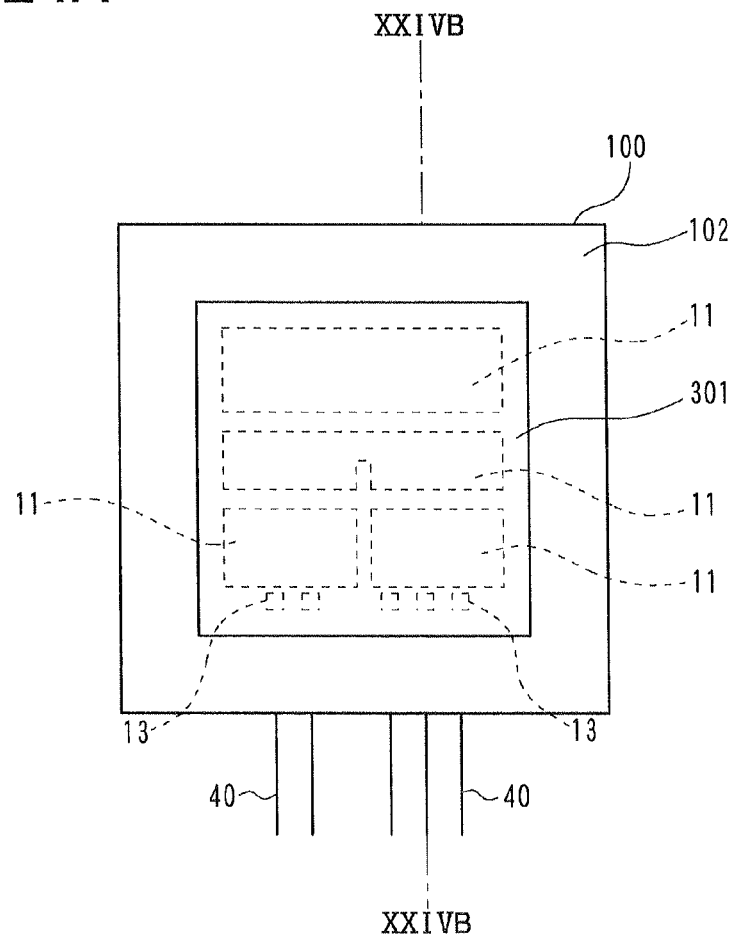
FIG. 24A is a diagram illustrating a plan view of a semiconductor package of a semiconductor device according to a fifteenth embodiment of the present invention.
Figure 24B:
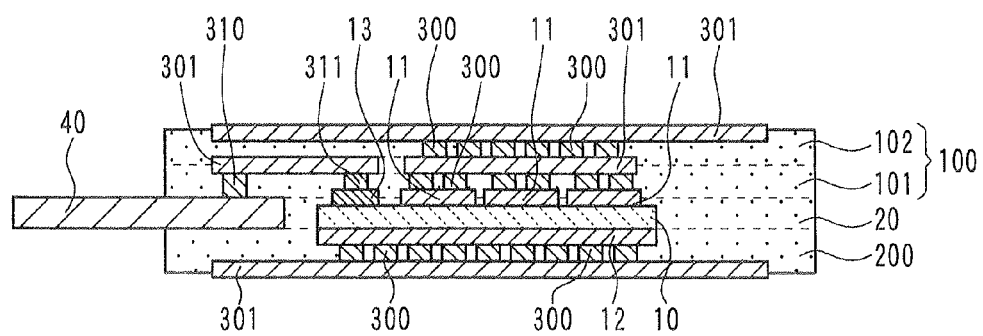
FIG. 24B is a diagram illustrating cross-sectional view taken along the line XXIVB-XXIVB in FIG. 24A.

A semiconductor device according to a fifteenth embodiment of the present invention is described below with reference to FIGS. 24A and 24B. FIG. 24A is a plan view of a semiconductor package of the semiconductor device viewed from a front surface side of a semiconductor element 10 packaged in the semiconductor package. FIG. 24B is a cross-sectional view taken along the line XXIVB-XXIVB in FIG. 24A.

Like the first embodiment, the semiconductor element 10 has a plate shape and includes the front-surface electrode 11 on the front surface and the back-surface electrode 12 on the back surface. The semiconductor element 10 is encapsulated and sealed in the resin member 20 in such a manner that the front-surface electrode 11 and the back-surface electrode 12 are exposed to the outer surface of the resin member 20. It is noted the lead terminal electrode pad 13 is located on the front surface of the semiconductor element 10 and exposed to the outer surface of the resin member 20.

The resin member 20 has the extension portion that extends from each side surface of the semiconductor element 10 in a direction parallel to the front surface of the semiconductor element 10. Thus, the entire side surface of the semiconductor element 10 is covered with the extension portion of the resin member 20.

Further, according to the fifteenth embodiment, the lead terminal 40 is located adjacent to the side surface of the semiconductor element 10 through the extension portion of the resin member 20. As described later, the lead terminal 40 is electrically connected to the lead terminal electrode pad 13.

Further, according to the fifteenth embodiment, a first resin sheet 100 made of thermoplastic resin is provided on the front surface-side of the semiconductor element 10. A first surface of the first resin sheet 100 is in direct contact with the outer surface of the resin member 20 so that the front surface of the semiconductor element 10 can be covered with the first resin sheet 100.

A conductive member 300 is provided in the first resin sheet 100. The conductive member 300 extends from the first surface to a second surface opposite to the first surface of the first resin sheet 100. The conductive member 300 is in contact with and electrically connected to the front-surface electrode 11 on the first surface-side of the first resin sheet 100.

Thus, the conductive member 300 allows the front-surface electrode 11 to be electrically connected to the second surface-side of the first resin sheet 100. That is, the conductive member 300 is configured as a pulling electrode for pulling out the front-surface electrode 11 of the semiconductor element 10 from the first surface-side to the second surface-side of the first resin sheet 100.

In an example shown in FIGS. 24A and 24B, the first resin sheet 100 has a multilayer structure including a first layer 101 and a second layer 102 that are thermally laminated together. The first layer 101 is located on the front surface of the semiconductor element 10, and the second layer 102 is located on the first layer 101. That is, the first layer 101 defines the first surface of the first resin sheet 100, and the second layer 102 defines the second surface of the first resin sheet 100.

The conductive member 300 is provided in the first layer 101 and the second layer 102 and penetrates the first layer 101 and the second layer 102 in their thickness directions. A conductive pattern 301 is located between the first layer 101 and the second layer 102 so that the conductive member 300 of the first layer 101 can be electrically connected to the conductive member 300 of the second layer 102 through the conductive pattern 301.

Further, another conductive pattern 301 is provided on the second surface of the first resin sheet 100, i.e., on an outer surface of the second layer 102 and connected to the conductive member 300 of the second layer 102. Thus, the front-surface electrode 11 can be electrically connected to external circuitry through the conductive members 300 and the conductive patterns 301.

As mentioned previously, the lead terminal 40 is located adjacent to the side surface of the semiconductor element 10 through the extension portion of the resin member 20. The lead terminal 40 is in contact with the first layer 101 of the first resin sheet 100 and encapsulated in the first resin sheet 100. It is noted that one end of the lead terminal 40 is exposed outside the first resin sheet 100 and can be electrically connected to external circuitry.

The lead terminal electrode pad 13 on the front surface of the semiconductor element 10 is electrically connected to the lead terminal 40.

A lead conductor 310 is provided in the first layer 101 of the first resin sheet 100 at a position corresponding to the lead terminal 40, and a pad conductor 311 is provided in the first layer 101 of the first resin sheet 100 at a position corresponding to the lead terminal electrode pad 13. Each of the lead conductor 310 and the pad conductor 311 penetrates the first layer 101 in its thickness direction.

The lead conductor 310 and the pad conductor 311 are electrically connected to the lead terminal 40 and the lead terminal electrode pad 13, respectively, by metal bonding or the like.

The lead conductor 310 and the pad conductor 311 provided in the first layer 101 are electrically connected together through the conductive pattern 301 between the first layer 101 and the second layer 102.

As described above, according to the fifteenth embodiment, the first resin sheet 100 has a multilayer structure. In such an approach, the lead terminal 40 and the lead terminal electrode pad 13 on the front surface of the semiconductor element 10 can be electrically connected together by an inner layer wire that is formed in the first resin sheet 100 and constructed with the conductive pattern 301 and the lead conductor 310 and the pad conductor 311.

For example, the first layer 101 and the second layer 102 of the first resin sheet 100 can be formed by molding a thermoplastic resin material such as liquid crystal polymer (LCP) into a desired sheet shape. For example, the conductive member 300, the lead conductor 310, and the pad conductor 311, each of which is configured as a through electrode, can be electrically connected to the conductive pattern 301 by metal bonding.

Specifically, the first resin sheet 100 can be formed in the following manner. Firstly, conductive foil as the conductive pattern 301 is patterned on one side of a thermoplastic resin sheet by etching or the like. Then, a hole reaching the conductive foil is formed in the thermoplastic resin sheet by stamping, drilling, or laser cutting from the other side of the thermoplastic resin sheet. Thus, a via hole with a bottom provided by the conductive foil is formed in the thermoplastic resin sheet. Then, conductive paste is injected into the via hole by using a screen printer or a dispenser. Thus, the via hole is filled with the conductive paste so that the conductive member 300 the lead conductor 310, and/or the pad conductor 311 can be formed in the thermoplastic resin sheet. Thus, the first layer 101 (the second layer 102) is formed. Then, the first layer 101 and the second layer 102 are stacked and bonded together by thermocompression bonding or the like. Thus, the first resin sheet 100 is formed.

Further, according to the fifteenth embodiment a second resin sheet 200 made of thermoplastic resin is provided on the back surface side of the semiconductor element 10. A first surface of the second resin sheet 200 is in direct contact with the outer surface of the resin member 20 so that the back surface of the semiconductor element 10 can be covered with the second resin sheet 200. In an example shown in FIGS. 24A and 24B, the second resin sheet 200 is configured as a single layer structure.

Another conductive member 300 is provided in the second resin sheet 200. The conductive member 300 extends from the first surface to a second surface opposite to the first surface of the second resin sheet 200. The conductive member 300 is in contact with and electrically connected to the back-surface electrode 12 on the first surface-side of the second resin sheet 200.

Thus, the conductive member 300 allows the back-surface electrode 12 to be electrically connected to the second surface-side of the second resin sheet 200. That is, the conductive member 300 is configured as a pulling electrode for pulling out the back-surface electrode 12 of the semiconductor element 10 from the first surface-side to the second surface-side of the second resin sheet 200.

Further, another conductive pattern 301 is provided on the second surface of the second resin sheet 200 and connected to the conductive member 300 of the second resin sheet 200. Thus, the back-surface electrode 12 can be electrically connected to external circuitry through the conductive member 300 and the conductive pattern 301.

The second resin sheet 200 can be formed by molding thermoplastic resin such as liquid crystal polymer into a desired sheet shape in the same manner as the first resin sheet 100. The conductive member 300 and the conductive pattern 301 of the second resin sheet 200 and be formed in the same manner as those of the first resin sheet 100.

Figure 25:
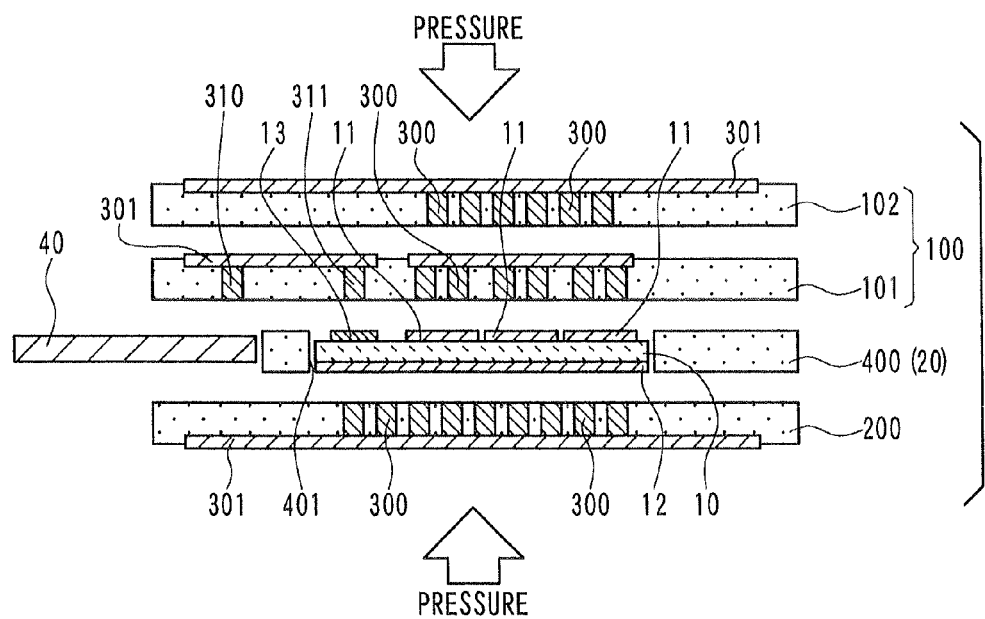
FIG. 25 is a diagram illustrating an exploded cross-sectional view of the semiconductor package of the semiconductor device according to the fifteenth embodiment.

Next, a method of manufacturing the semiconductor package of the semiconductor device according to the fifteenth embodiment is described below with reference to FIG. 25. FIG. 25 is a cross-sectional exploded view of the semiconductor package.

In the method, the semiconductor element 10 is encapsulated in the resin member 20 in such a manner that the front-surface electrode 11 and the back-surface electrode 12 are exposed to the outer surface of the resin member 20 and that the side surface of the semiconductor element 10 is covered with the extension portion of the resin member 20. Further, the first resin sheet 100 and the second resin sheet 200 are provided on the front surface-side and the back surface-side of the semiconductor element 10 to cover the front surface and the back surface of the semiconductor element 10.

Firstly, the first resin sheet 100 having the conductive member 300, which is located at a position corresponding to the front-surface electrode 11 and penetrates the first surface to the second surface of the first resin sheet 100, is prepared. Specifically, the first layer 101 and the second layer 102 are prepared.

Likewise, the second resin sheet 200 having the conductive member 300, which is located at a position corresponding to the back-surface electrode 11 and penetrates the first surface to the second surface of the second resin sheet 200, is prepared.

Further, a third resin sheet 400 as the resin member 20 is prepared. The third resin sheet 400 is made of thermoplastic resin and has a through hole 401 extending in its thickness direction. The through hole 401 can be formed stamping, drilling, laser cutting or the like. The third resin sheet 400 has a cutout for receiving the lead terminal 40. For example, the first, second, and third resin sheets 100, 200, and 300 can be made of the same type of thermoplastic resin.

Then, the semiconductor element 10 is placed in the through hole 401 of the third resin sheet 400 so that the front surface and the back surface of the semiconductor elements 10 can be exposed from first and second openings of the through hole 401, respectively. Further, the lead terminal 40 is placed in the cutout of the third resin sheet 400.

Then, the first layer 101 is placed on the front surface-side of the semiconductor element 10, and the second layer 102 is placed on the first layer 101.

Thus, the first surface (i.e., the first layer 101) of the first resin sheet 100 is in direct contact with the front surface of the semiconductor element 10 and an outer surface of the third resin sheet 400 so that the conductive member 300 of the first resin sheet 100 can be in contact with and electrically connected to the front-surface electrode 11. In this way, the front surface of the semiconductor element 10 is covered with the first resin sheet 100.

Likewise, the second resin sheet 200 is placed on the back surface-side of the semiconductor element 10. Thus, the first surface of the second resin sheet 200 is in direct contact with the back surface of the semiconductor element 10 and the outer surface of the third resin sheet 400 so that the conductive member 300 of the second resin sheet 200 can be in contact with and electrically connected to the back-surface electrode 12. In this way, the back surface of the semiconductor element 10 is covered with the second resin sheet 200.

Then, thermocompression bonding is performed by applying pressure to the second surface of the first resin sheet 100 and the second surface of the second resin sheet 200 as indicated by an arrow in FIG. 25 while applying heat. As a result of the thermocompression bonding, the first, second, and third resin sheets 100, 200, and 400 are bonded together, and the conductive members and the conductors are joined together.

In this way the semiconductor package of the semiconductor device according to the fifteenth embodiment is manufactured. According the method described above, the resin sheets are bonded together at a time by a thermocompression bonding method so that the semiconductor package can be suitably manufactured.

Figure 26:
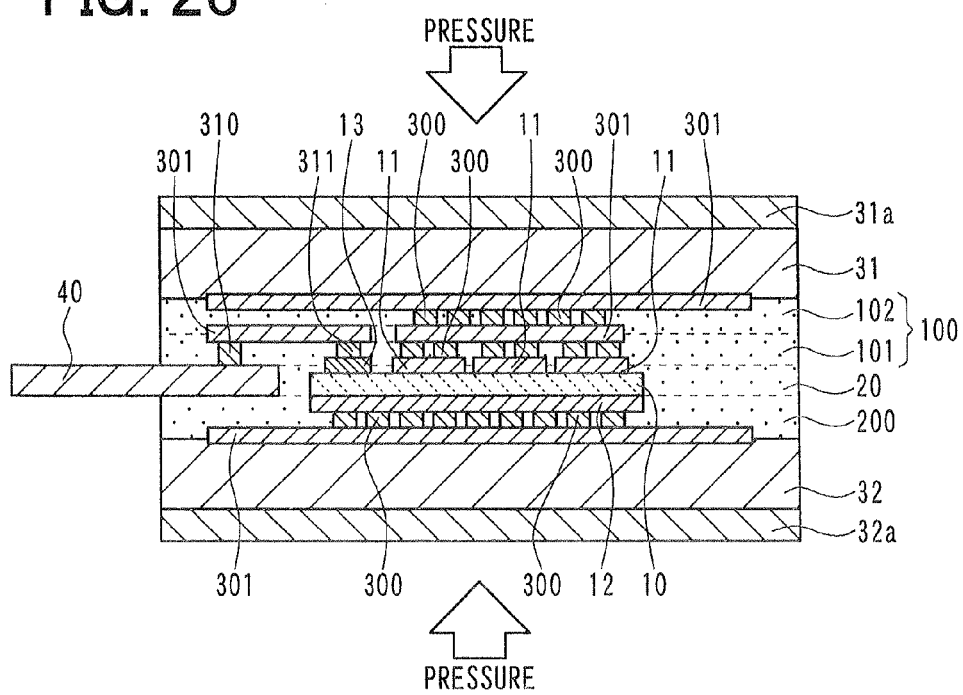
FIG. 26 is a diagram illustrating a cross-sectional view of the semiconductor device according to the fifteenth embodiment.

FIG. 26 is a cross-sectional view of the semiconductor device according to the fifteenth embodiment. The semiconductor device is manufactured by adding the first and second heatsinks 31 and 32 to the semiconductor package of FIG. 25.

In an example of FIG. 26, the first heatsink 31 is provided on the second surface side of the first resin sheet 100, and the second heatsink 32 is provided on the second surface side of the second resin sheet 200. The first and second heatsinks 31 and 32 are the same as those shown in FIGS. 2A and 2B.

The first heatsink 31 is under pressure so that the first heatsink 31 can be in direct contact with the conductive pattern 301 on the second surface side of the first resin sheet 100. Thus, the first heatsink 31 is electrically and thermally connected through the conductive pattern 301 to the conductive member 300 on the second surface side of the first resin sheet 100. The second heatsink 32 is under pressure so that the second heatsink 32 can be in direct contact with the conductive pattern 301 on the second surface side of the second resin sheet 200. Thus, the second heatsink 32 is electrically and thermally connected through the conductive pattern 301 to the conductive member 300 on the second surface side of the second resin sheet 100.

For example, the first and second heatsinks 31 and 32 can be under pressure by sandwiching the semiconductor package between the first and second heatsinks 31 and 32 using a pressing member such as a screw, a spring, and/or the like. The first and second heatsinks 31 and 32 can be connected to external cooling members (not shown) through the first and second electrically insulating films 32a and 32b, respectively, so as to increase heat-radiation performance.

According to the fifteenth embodiment, the conductive members 300 provided in the first and second resin sheets 100 and 200 allow the front-surface and the back-surface electrodes 11 and 12 of the semiconductor element 10 to be electrically and thermally pulled out to the outer surface-sides of the first and second resin sheets 100 and 200. Therefore, the first and second heatsinks 31 and 32 can be in contact with the front and back surfaces of the semiconductor element 10 through the first and second resin sheets 100 and 200 by applying pressure to the first and second heatsinks 31 and 32.

Further, according to the fifteenth embodiment, a multilayer substrate as the semiconductor package is formed by sandwiching the semiconductor element 10 and the resin member 20 between the first and second resin sheets 100 and 200. Thus, the semiconductor element 10 is packaged in the multilayer substrate. Since the first and second resin sheets 100 and 200 are made of thermoplastic resin the multiplayer substrate can be manufactured by bonding together the resin member 20 and the first and second resin sheets 100 and 200 at a time using a thermocompression bonding method as described above. Further, since the first and second resin sheets 100 and 200 are made of thermoplastic resin, the first and second resin sheets 100 and 200 can be recycled.

As described above, according to the fifteenth embodiment, the third resin sheet 400 as the resin member 20 is made of the same type of thermoplastic resin as the first and second resin sheets 100 and 200.

In such an approach, the resin member 20 is tightly bonded to the first and second resin sheets 100 and 200. Specifically, since a fusion occurs in the resin member 20 in addition to the first and second resin sheets 100 and 200 during thermocompression bonding, the resin member 20 and the first and second resin sheets 100 and 200 are fusion bonded together.

Figure 27:
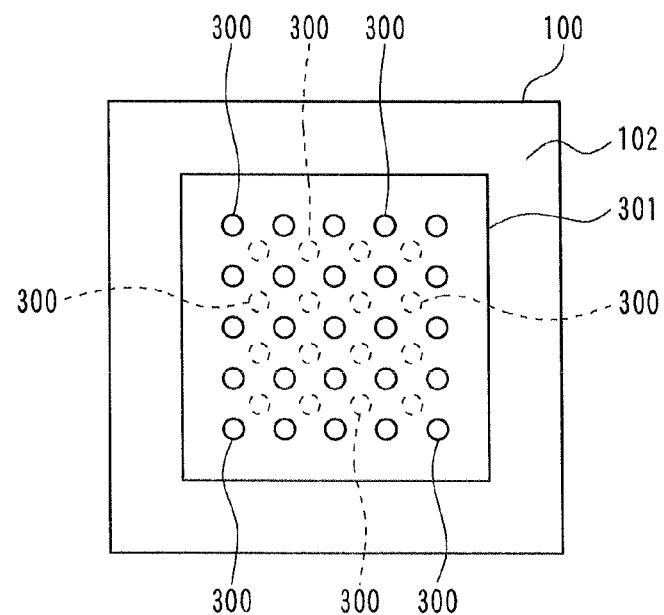
FIG. 27 is a diagram illustrating an example of a layout pattern of conductive members in a first resin sheet of the semiconductor device according to the fifteenth embodiment.

For example, the conductive members 300 provided in the first layer 101 and the second layer 102 of the first resin sheet 100 can be laid out as shown in FIG. 27. In FIG. 27, a solid circle represents the conductive member 300 provided in the first layer 101, and a broken circle represents the conductive member 300 provided in the second layer 102. In each of the first layer 101 and the second layer 102, multiple conductive members 300 are arranged in a predetermined pattern such as a matrix.

In an example of FIG. 27, the conductive members 300 provided in the first layer 101 are misaligned with the conductive members 300 provided in the second layer 102. In such an approach, stress in a direction in which the first resin sheet 100 is likely to warp is reduced so that warpage of the first resin sheet 100 can be reduced. Alternatively, the conductive members 300 provided in the first layer 101 can be aligned with the conductive members 300 provided in the second layer 102.

The lead terminal 40 can be a device other than a lead, as long as the device can be electrically connected to the pad 13 on the front surface of the semiconductor element 10. For example, the lead terminal 40 can be another semiconductor element 10.

In the example shown in FIGS. 24A-27, the first resin sheet 100 has a multilayer structure, and the second resin sheet 200 has a single layer structure. Alternatively, the first resin sheet 100 can have a single layer structure and the second resin sheet 200 can have a multilayer structure. Alternatively, both the first resin sheet 100 and the second resin sheet 200 can have a single layer structure or a multilayer structure. The multilayer structure can be more than two layers.

As described above, the first, second, and third resin sheets 100, 200, and 400 can be made of a liquid crystal polymer (LCP). Alternatively, the first, second, and third resin sheets 100, 200, and 400 can be made of a polyether ether ketone (PEEK), a polyether imide (PEI), a polyphenylene sulfide (PPS), a thermoplastic polyimide, or the like.

As described above, the first, second, and third resin sheets 100, 200, and 400 can be made of the same type of thermoplastic resin. Alternatively, the first, second, and third resin sheets 100, 200, and 400 can be made of different types of thermoplastic resin. The first and fifteenth embodiments can be combined so that the semiconductor package shown in FIGS. 1A-1C can be sandwiched between the first and second resin sheets 100 and 200.

Sixteenth Embodiment

Figure 28:
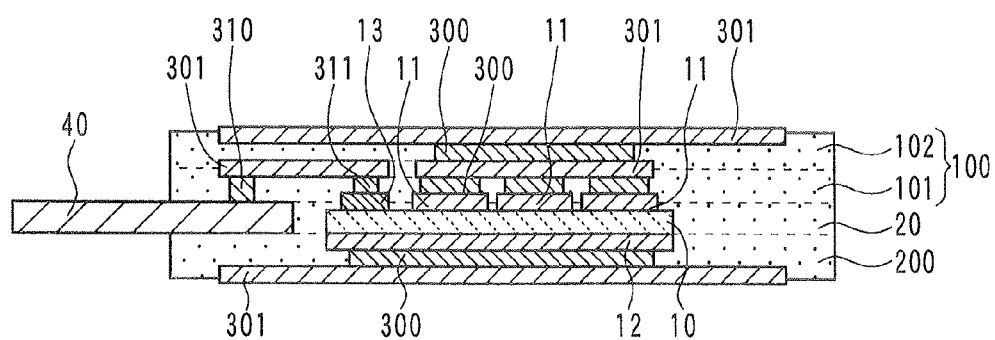
FIG. 28 is a diagram illustrating a cross-sectional view of a semiconductor package of a semiconductor device according to a sixteenth embodiment.

A semiconductor device according to a sixteenth embodiment of the present invention is described below with reference to FIG. 28. FIG. 24A is a cross-sectional view of a semiconductor package of the semiconductor device. A difference between the fifteenth embodiment and the sixteenth embodiment is as follows.

According to the fifteenth embodiment, in the first and second resin sheets 100 and 200, multiple conductive members 300 are provided to one front-surface electrode 11 and one back-surface electrode 12. In contrast, according to the sixteenth embodiment, in the first and second resin sheets 100 and 200, one conductive member 300 is provided to one front-surface electrode 11 and one back-surface electrode 12.

Further, according to the sixteenth embodiment, a single conductive member 300 provided in the second layer 102 of the first resin sheet 100 covers multiple conductive members 300 provided in the second layer 102 of the first resin sheet 100. In such an approach, heat radiation path is increased so that heat radiation performance can be increased.

Figure 29:
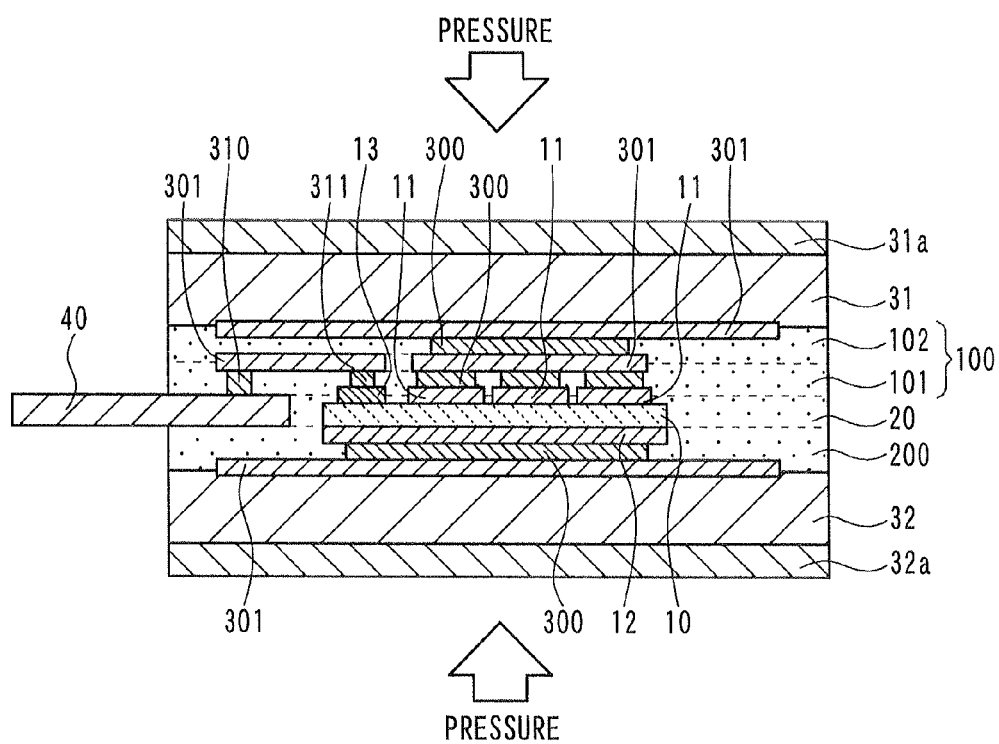
FIG. 29 is a diagram illustrating a cross-sectional view of the semiconductor device according to the sixteenth embodiment.

FIG. 29 is a cross-sectional view of the semiconductor device according to the sixteenth embodiment. The semiconductor device is manufactured by adding the first and second heatsinks 31 and 32 to the semiconductor package of FIG. 28. The first and second heatsinks 31 and 32 are the same as those shown in FIG. 26 and attached in the same manner those shown in FIG. 26.

In an example of FIG. 29, the first heatsink 31 is provided on the second surface side of the first resin sheet 100, and the second heatsink 32 is provided on the second surface side of the second resin sheet 200.

The first heatsink 31 is pressed against the first resin sheet 100 and under pressure so that the first heatsink 31 can be in direct contact with the conductive pattern 301 on the second surface side of the first resin sheet 100. Thus, the first heatsink 31 is electrically and thermally connected through the conductive pattern 301 to the conductive member 300 on the second surface side of the first resin sheet 100. The second heatsink 32 is pressed against the second resin sheet 200 and under pressure so that the second heatsink 32 can be in direct contact with the conductive pattern 301 on the second surface side of the second resin sheet 200. Thus, the second heatsink 32 is electrically and thermally connected through the conductive pattern 301 to the conductive member 300 on the second surface side of the second resin sheet 100.

Seventeenth Embodiment

Figure 31:
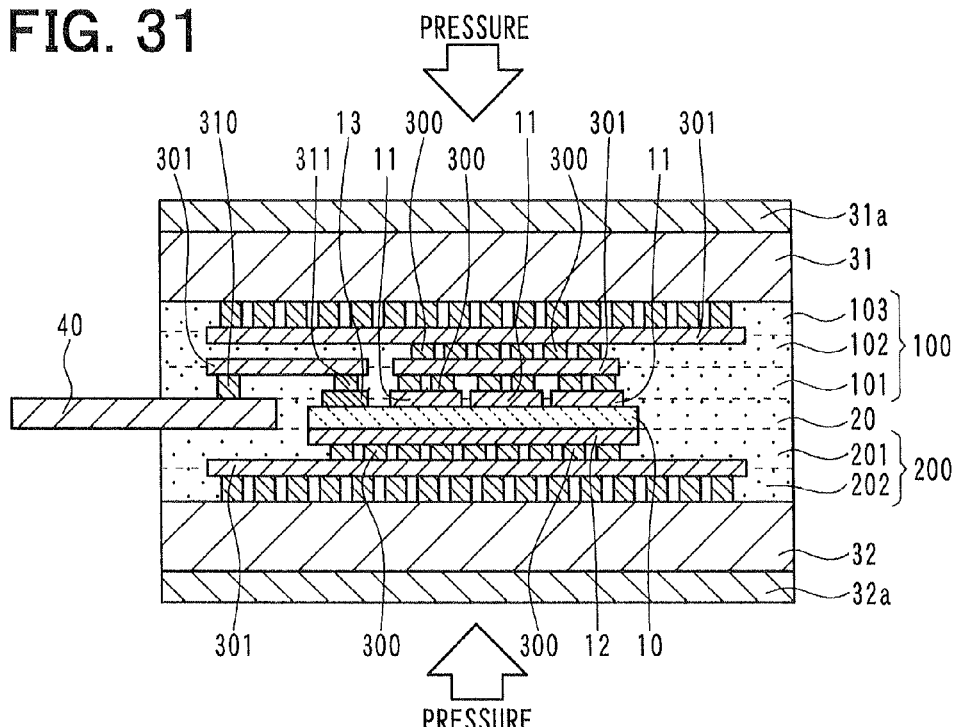
FIG. 31 is a diagram illustrating a cross-sectional view of the semiconductor device according to the seventeenth embodiment.

A semiconductor device according to a seventeenth embodiment of the present invention is described below with reference to FIG. 31. FIG. 31 is a cross-sectional exploded view of the semiconductor device. A difference between the fifteenth embodiment and the seventeenth embodiment is as follows.

According to the seventeenth embodiment, the first resin sheet 100 includes a third layer 103 in addition to the first and second layers 102 and 103. The third layer 103 is made of thermoplastic resin and located between the second layer 102 and the first heatsink 31. The conductive member 30 is provided in the third layer 103 and penetrates the third layer 103 in its thickness direction. The second resin sheet 200 includes a first layer 201 and a second layer 202. The first layer 201 is equivalent to the second resin sheet 200 of the fifteenth embodiment. The second layer 202 is made of thermoplastic resin and located between the first layer 201 and the second heatsink 32. The conductive member 30 is provided in the third layer 103 and penetrates the third layer 103 in its thickness direction.

That is, the first resin sheet 100 has a three-layer structure, and the second resin sheet 200 has a two-layer structure. In each of the first resin sheet 100 and the second resin sheet 200, the conductive member 30 provided in one layer is electrically connected to the conductive member 30 provided in another layer through the conductive pattern 301 between the layers.

Figure 30:
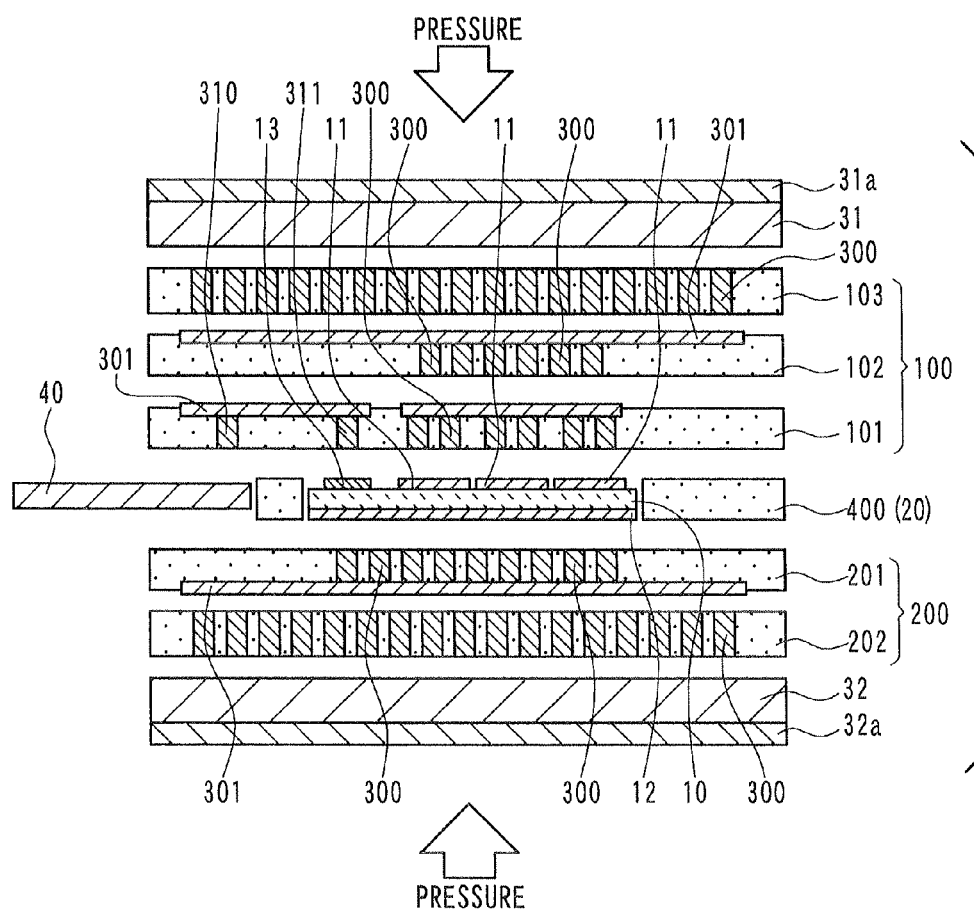
FIG. 30 is a diagram illustrating an exploded cross-sectional view of a semiconductor device according to a seventeenth embodiment of the present invention.

As shown in FIG. 30, the first resin sheet 100 and the first heatsink 31 are provided on the first surface-side of the third resin sheet 400 in which the semiconductor element 10 and the lead terminal 40 are encapsulated, and the second resin sheet 200 and the second heatsink 32 are provided on the second surface-side of the third resin sheet 400. Then, thermocompression bonding is performed by applying pressure to the first heatsink 31 and the second heatsink 32 as indicated by an arrow in FIG. 30 while applying heat. As a result of the thermocompression bonding, a fusion occurs in the resin sheets 100, 200, and 400, and the resin sheets 100, 200, and 400 and the heatsinks 31 and 32 are bonded together at a time due to the fusion of the resin sheets 100, 200, and 400 so that the semiconductor device can be manufactured.

In the semiconductor device, the first heatsink 31 is in direct contact with the second surface of the first resin sheet 100 and electrically connected to the conductive pattern 301 on the second surface side of the first resin sheet 100, and the second heatsink 32 is in direct contact with the second surface of the second resin sheet 200 and electrically connected to the conductive pattern 301 on the second surface side of the second resin sheet 200.

As described above, according to the seventeenth embodiment, the first heatsink 31 and the first resin sheet 100 are bonded together by the fusion of the first resin sheet 100, and the second heatsink 32 and the second resin sheet 200 are bonded together by the fusion of the second resin sheet 200.

That is, the thermocompression bonding causes the first and second resin sheets 100 and 200 to be deformed and fusion-bonded to the first and second heatsinks 31 and 32, respectively. Therefore, there is no need to use a pressing member, such as a screw or a spring for pressing the first and second heatsinks 31, 32 against the semiconductor package. Further, since the first and second resin sheets 100 and 200 are deformed, the first and second heatsinks 31 and 32 can remain in close contact with the first and second resin sheets 100 and 200 even if contact surfaces between the first and second resin sheets 100 and 200 and the first and second heatsinks 31 and 32 are rough.

Figure 32:
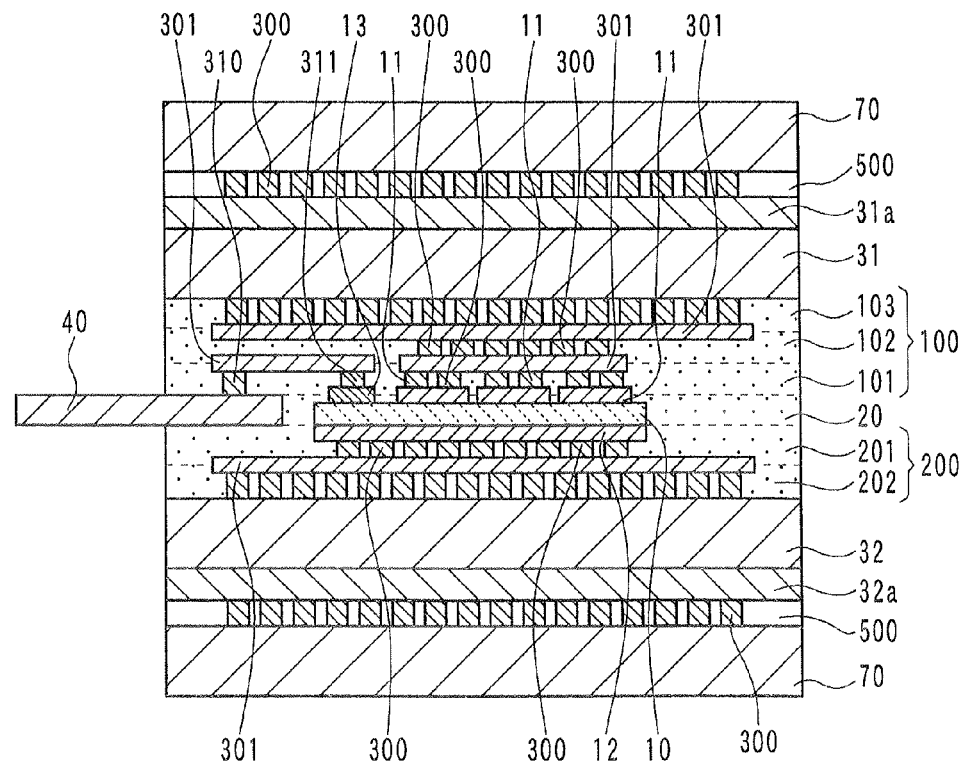
FIG. 32 is a diagram illustrating a cross-sectional view of the semiconductor device of FIG. 31 to which cooling members are attached.

As shown in FIG. 32, the cooling member 70 can be attached to the cooling surface of the first heatsink 31 through the electrically insulating film 31a. Likewise, the cooling member 70 can be attached to the cooling surface of the second heatsink 32 through the electrically insulating film 32a.

In this case, a fourth resin sheet 500 made of thermoplastic resin is placed between the first heatsink 31 and the cooling member 70 and between the second heatsink 32 and the cooling member 70. The conductive member 30 is provided in the fourth resin sheet 500. Then, thermocompression bonding is performed by applying pressure to each cooling member 70 while applying heat. As a result of the thermocompression bonding, a fusion occurs in the resin sheets 100, 200, 400, and 500, and the resin sheets 100, 200, 400, and 500, the heatsinks 31 and 32, and the cooling members 70 are bonded together at a time due to the fusion of the resin sheets 100, 200, 400, and 500 so that the semiconductor device can be manufactured. Since the resin sheets 500 are deformed by the thermocompression bonding, the first and second heatsinks 31 and 32 can be surely joined to the cooling members 70 through the resin sheets 500 even if contact surfaces between the cooling members 70 and the first and second heatsinks 31 and 32 are rough.

Eighteenth Embodiment

Figure 33:
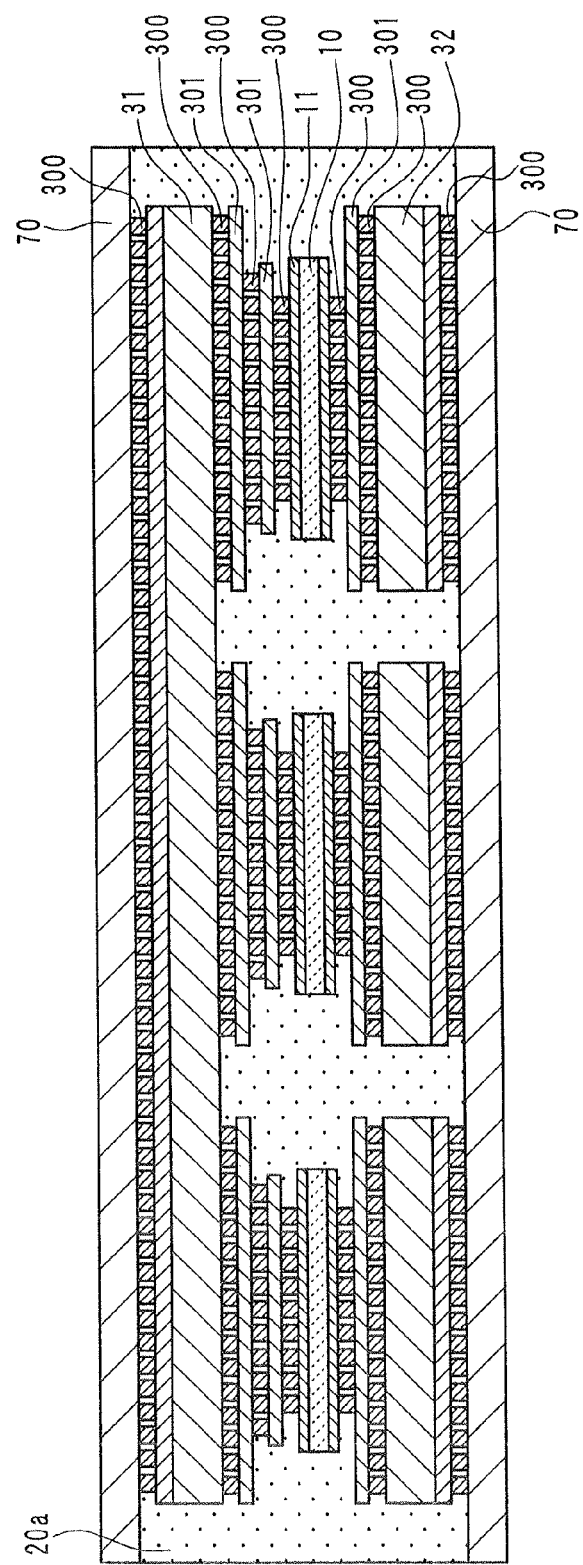
FIG. 33 is a diagram illustrating a cross-sectional view of a semiconductor device according to an eighteenth embodiment of the present invention.
Figure 34:
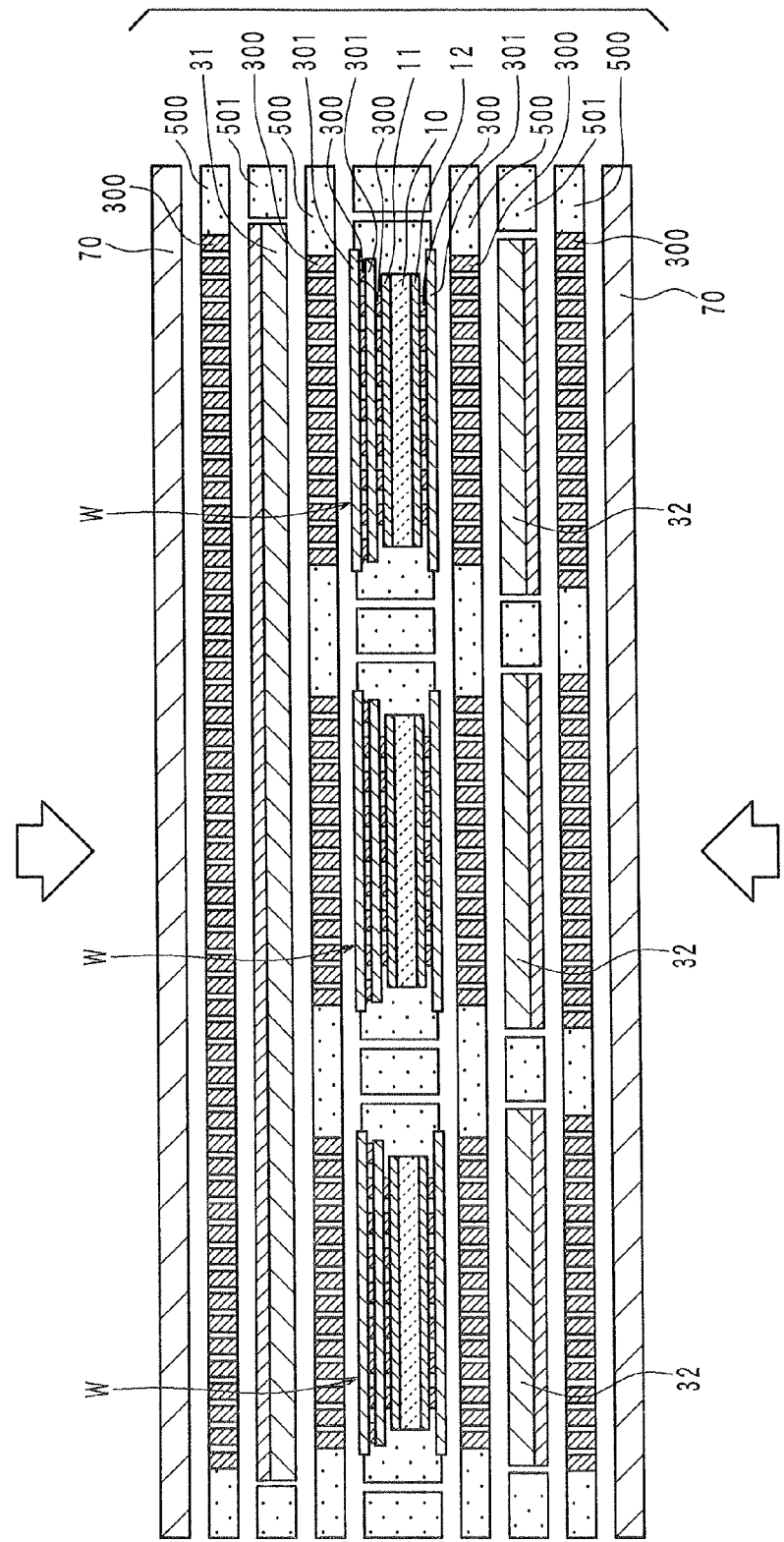
FIG. 34 is a diagram illustrating an exploded cross-sectional view of the semiconductor device of FIG. 33.

A semiconductor device according to an eighteenth embodiment of the present invention is described below with reference to FIGS. 33 and 34. FIG. 33 is a cross-sectional view of the semiconductor device. FIG. 34 is an exploded cross-sectional view of the semiconductor device. According to the eighteenth embodiment, multiple semiconductor packages having the first and second resin sheets 100 and 200 shown in FIGS. 24A and 24B are packaged together in a common resin member 20a to form a 3-in-1 module or a 6-in-1 module as shown in FIGS. 7A-17C.

In FIG. 33, three semiconductor elements 10 are shown. Each semiconductor element 10 is configured in the same manner as shown in FIGS. 17A-17C. That is, the first resin sheet 100 is provided on the front surface side of the semiconductor element 10, and the front-surface electrode 11 is electrically and thermally connected to the first heatsink 31 through the conductive member 300 provided in the first resin sheet 100.

The second resin sheet 200 is provided on the back surface side of the semiconductor element 10, and the back-surface electrode 12 is electrically and thermally connected to the second heatsink 32 through the conductive member 300 provided in the second resin sheet 200. The resin member 20a is equivalent to a lamination of the resin member 20 shown in FIGS. 24A and 24B and the first and second resin sheets 100 and 200. It is noted that the boundaries between the resin member 20 and the first and second resin sheets 100 and 200 are omitted in FIG. 33.

The semiconductor device shown in FIG. 33 can be manufactured by stacking the parts of the semiconductor device in a manner as shown in FIG. 34 and then by performing thermocompression bonding so that the parts can be bonded together at a time.

Specifically, multiple workpieces W, each of which is equivalent to the semiconductor package shown in FIGS. 24A and 24B, are arranged in parallel. The resin sheet 500 having the conductive member 300 penetrating the resin sheet 500 is provided on both the front surface side and the back surface side of the semiconductor element 10 of each workpiece. Further, a resin sheet 501 made of thermoplastic resin and having a through hole filled with the first heatsink 31 is placed outside one resin sheet 500, and another resin sheet 501 made of thermoplastic resin and having an through hole filled with the second heatsink 32 is placed outside the other resin sheet 500.

Further, additional resin sheet 500 is placed outside each resin sheet 501, and the cooling member 70 is placed outside each additional resin sheet 500. Then, thermocompression bonding of these parts is performed by applying pressure as indicated by an arrow in FIG. 34 while applying heat. As a result of the thermocompression bonding, a fusion occurs in the resin sheets 500 and 501 so that the parts can be bonded together at a time. Thus, the semiconductor device shown in FIG. 33 can be manufactured.

Since the resin sheets 500 and 501 are deformed by the thermocompression bonding, the first and second heatsinks 31 and 32 can be surely joined to the cooling members 70 through the resin sheets 500 and 501 even if contact surfaces between the cooling members 70 and the first and second heatsinks 31 and 32 are rough.

Nineteenth Embodiment

Figure 35:
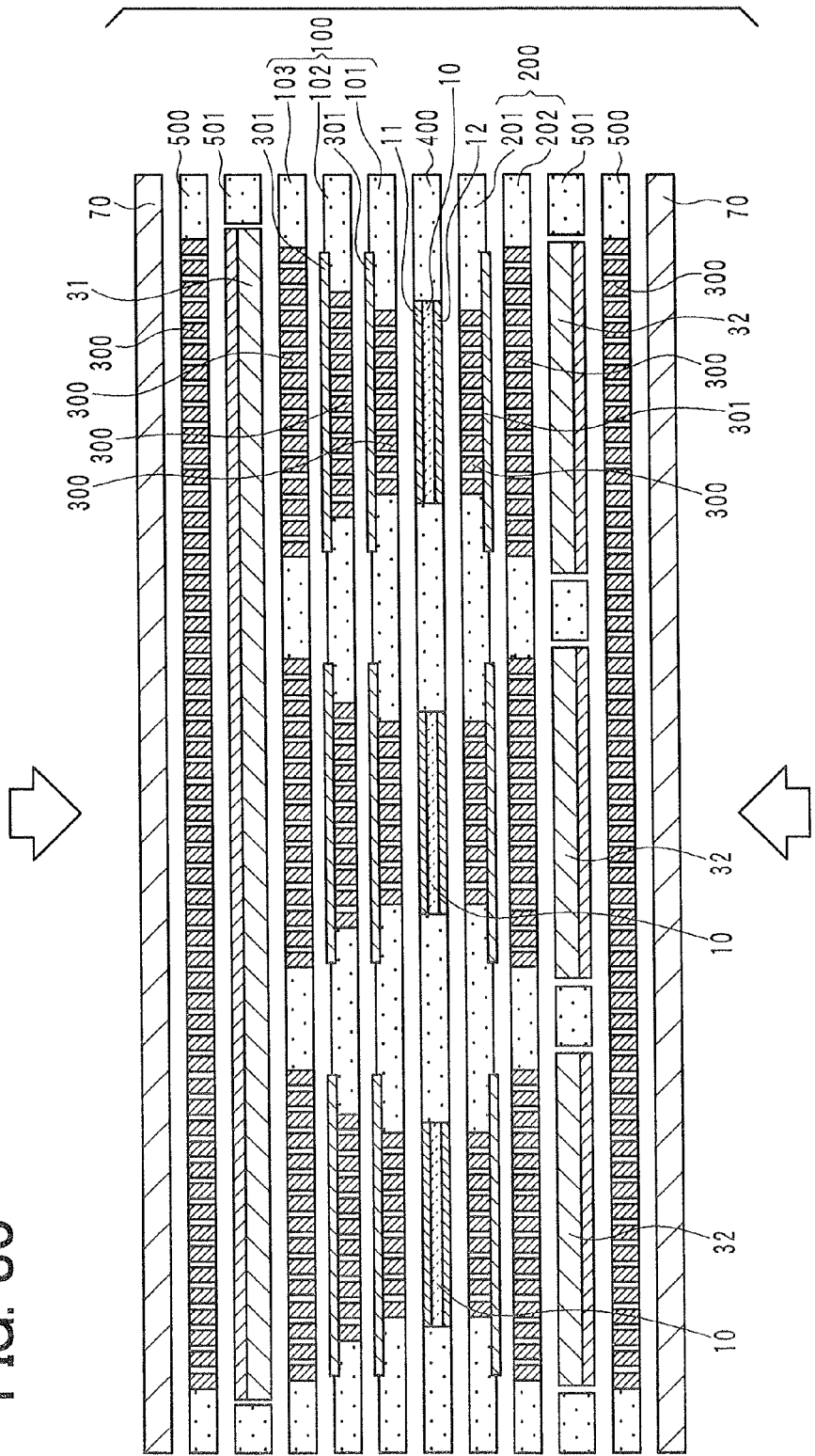
FIG. 35 is a diagram illustrating an exploded cross-sectional view of a semiconductor device according to a nineteenth embodiment of the present invention.

A semiconductor device according to a nineteenth embodiment of the present invention is described below with reference to FIG. 35. FIG. 35 is an exploded cross-sectional view of the semiconductor device. The semiconductor device according to the nineteenth embodiment has a structure similar to that of the semiconductor device shown in FIG. 33, but is manufactured by a different method.

In the eighteenth embodiment, multiple workpieces W, each of which is equivalent to the semiconductor package shown in FIGS. 24A and 24B, are arranged in parallel, and then thermoplastic bonding of the workpieces W and the resin sheets placed outside the workpieces W is performed so that the parts can be bonded together at a time.

In the nineteenth embodiment, as shown in FIG. 35, the semiconductor elements 10 are inserted in a common resin sheet 400, and the remaining parts of the semiconductor device are stacked on the common resin sheet 400.

Specifically, the first resin sheet 100 including the three layers 101-103, the resin sheet 501 having the first heatsink 31, the resin sheet 500 having the conductive member 300, and the cooling member 70 are stacked in this order on the front surface side of the semiconductor element 10.

Likewise, the second resin sheet 200 including the two layers 201 and 202, the resin sheet 501 having the second heatsink 32, the resin sheet 500 having the conductive member 300, and the cooling member 70 are stacked in this order on the back surface side of the semiconductor element 10. Then, thermocompression bonding of these parts is performed by applying pressure as indicated by an arrow in FIG. 34 while applying heat. As a result of the thermocompression bonding, a fusion occurs in the resin sheets 500 and 501 so that the parts can be bonded together at a time. Thus, the semiconductor device having a structure similar to that shown in FIG. 33 can be manufactured.

In the example shown in FIG. 35, the number of conductive members 300 in the third layer 103 is greater than the number of the conductive members 300 in the second layer 102, and the number of the conductive members 300 in the second layer 102 is greater than the number of the conductive members 300 in the first layer 101. Thus, the width of a layout area of the conductive members 300 is increased from the front-surface electrode 11-side to the first heatsink 31-side.

Therefore, after the first, second, and the third layers 101-103 are bonded together into the first resin sheet 100 by the thermocompression bonding, the layout area of the conductive members 300 in the first resin sheet 100 is increased from the semiconductor element 10-side to the first heatsink 31-side and formed into a trapezoidal shape. For example, an acute angle of the trapezoidal shape can be about 45 degrees. In such an approach, heat radiation path is increased from the semiconductor element 10-side to the first heatsink 31-side so that heat radiation performance can be increased.

Further, such a layout of the conductive members 300 can reduce a contact surface between the front-surface electrode 11 and the conductive members 300. For example the width of the contact surface between the conductive member 300 and the front-surface electrode 11 can be reduced less than the width of the semiconductor element 10. Therefore, when an element that is weak against heat is arranged near the semiconductor element 10, a distance between the element and the semiconductor element 10 can be reduced. Accordingly, the size of the semiconductor device can be reduced.

The conductive members 300 can be laid out in the second resin sheet 200 in the same manner as in the first resin sheet 100. The layout of the conductive members 300 described in the nineteenth embodiment can be applied to any other embodiment having the first and second resin sheets 100 and 200.

Twentieth Embodiment

Figure 36A:
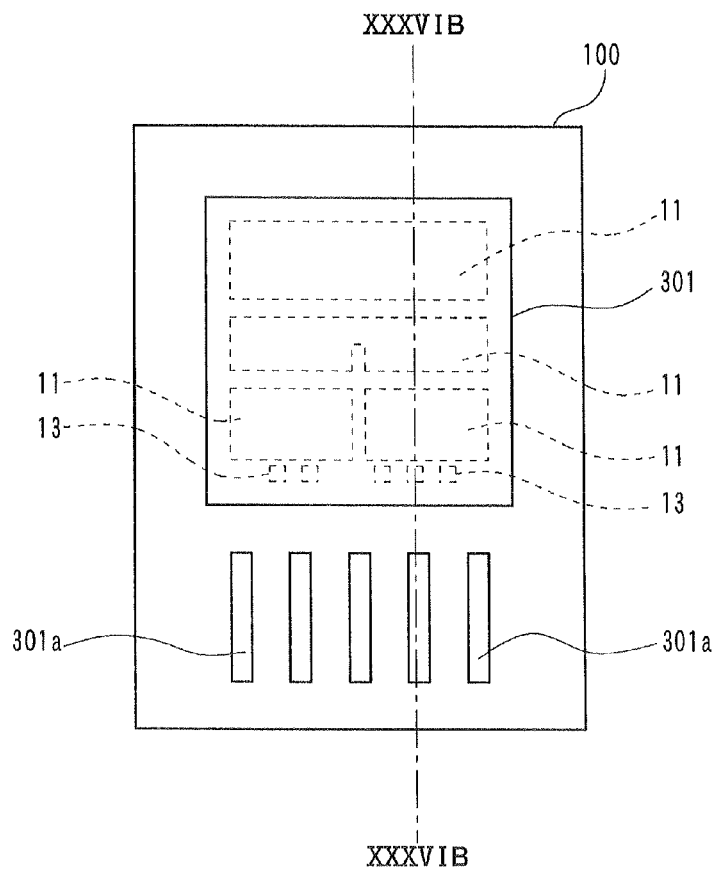
FIG. 36A is a diagram illustrating a plan view of a semiconductor package of a semiconductor device according to a twentieth embodiment of the present invention.
Figure 36B:
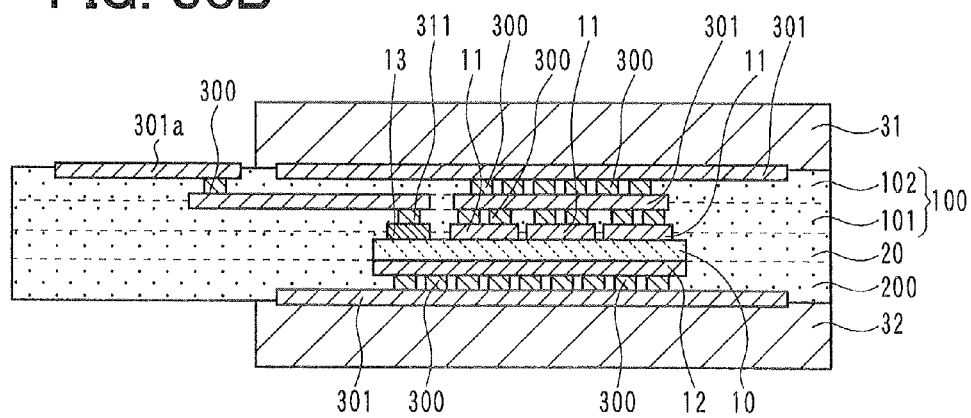
FIG. 36B is a diagram illustrating a cross-sectional view of the semiconductor device taken along the line XXXVIB-XXXVIB in FIG. 36A.
Figure 37:
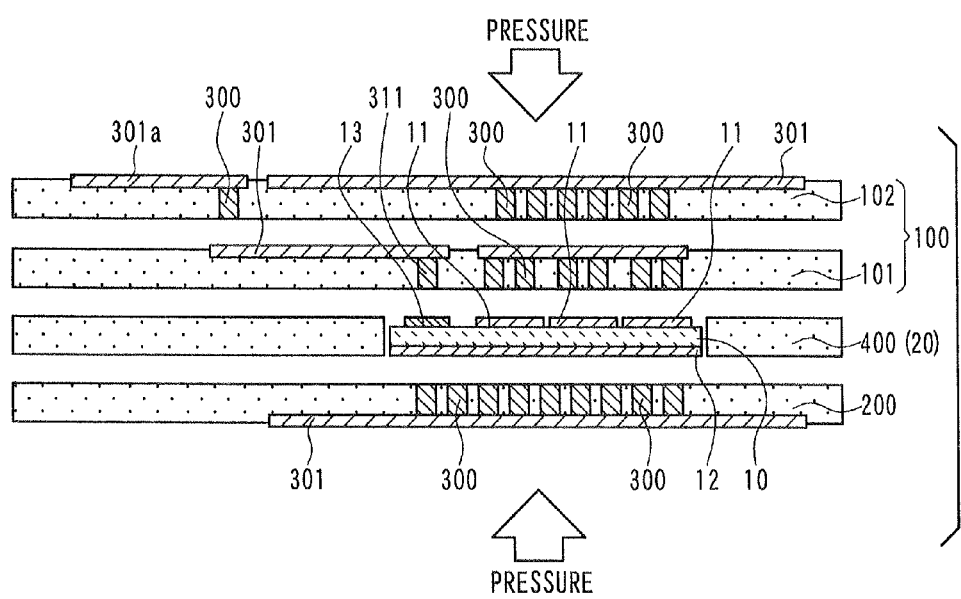
FIG. 37 is a diagram illustrating an exploded cross-sectional view of the semiconductor package of the semiconductor device according to the twentieth embodiment.

A semiconductor device according to a twentieth embodiment of the present invention is described below with reference to FIGS. 36A and 36B and 37. FIG. 36A is a plan view of a semiconductor package of the semiconductor device viewed from a front surface side of a semiconductor element 10 packaged in the semiconductor package. FIG. 36B is a cross-sectional view of the semiconductor device taken along the line XXXVIB-XXXVIB in FIG. 36A. FIG. 37 is an exploded cross-sectional view of the semiconductor package. The twentieth embodiment corresponds to a modification of the fifteenth embodiment. A difference between the fifteenth embodiment and the twentieth embodiment is as follows.

According to the twentieth embodiment, the lead terminal 40 is removed, and part of the conductive pattern 301 is configured to serve as a lead terminal. Specifically, part of the conductive pattern 301 on the second surface (i.e., second layer 102) of the first resin sheet 100 is configured as a lead terminal conductive pattern 301a.

As shown in FIG. 36B, the lead terminal conductive pattern 301a is not covered with the first heatsink 31 so that the semiconductor device can be electrically connected to external circuitry through the lead terminal conductive pattern 301a.

The lead terminal conductive pattern 301a is electrically connected to the lead terminal electrode pad 13 through the pad conductor 311, the conductive pattern 301 between the first layer 101 and the second layer 102, and the conductive member 300 provided in the second layer 102. In such a structure, flexibility of electrical connection of the lead terminal electrode pad 13 is improved so that an integrated circuit (IC) as a semiconductor element 10 can be easily incorporated in the semiconductor device.

As shown in FIG. 37, the first resin sheet 100 having the first and second layers 101 and 102 is placed on the first surface side of the third resin sheet 400 having the semiconductor element 10, and the second resin sheet 200 is placed on the second surface side of the third resin sheet 400. Then, thermocompression bonding of these parts is performed so that the parts can be bonded together at a time. Thus, the semiconductor package shown in FIGS. 36A and 36B can be manufactured.

Modifications

The embodiments described above can be modified in various ways. For example, the semiconductor element 10 can be an element other than an IGBT. The semiconductor element 10 can have no lead terminal electrode pad 13.

Such changes and modifications are to be understood as being within the scope of the present invention as defined by the appended claims.

What is claimed is:

1. A semiconductor device comprising:
a plate-shaped semiconductor element having a front surface, a back surface opposite to the front surface, and a side surface between the front surface and the back surface, the semiconductor element including a front-surface electrode on the front surface and a back-surface electrode on the back surface; and
an electrically insulating resin member that encapsulates and seals the semiconductor element, wherein
the front-surface electrode has an exposed surface exposed to a front side of an outer surface of the resin member,
the back-surface electrode has an exposed surface exposed to a back side of the outer surface of the resin member,
the resin member has a first extension portion that covers the entire side surface of the semiconductor element and extends from the side surface of the semiconductor element in a direction parallel to the front surface of the semiconductor element, and
the resin member and the first extension portion are a single piece of resin.

2. The semiconductor device according to claim 1, wherein
the exposed surface of the front-surface electrode is flush with the front side of the outer surface of the resin member, and
the exposed surface of the back-surface electrode is flush with the back side of the outer surface of the resin member.

3. The semiconductor device according to claim 1, further comprising:
a first heatsink having a heat radiation property and an electrical conductivity and located on the front side of the outer surface of the resin member; and
a second heatsink having a heat radiation property and an electrical conductivity and located on the back side of the outer surface of the resin member, wherein
the first heatsink is pressed against the resin member and in direct contact with the exposed surface of the front-surface electrode, and
the second heatsink is pressed against the resin member and in direct contact with the exposed surface of the back-surface electrode.

4. The semiconductor device according to claim 3, wherein
the resin member has a second extension portion extending from the first extension portion,
the second extension portion is located outside an outer edge of the first heatsink and an outer edge of the second heatsink, and
the resin member, the first extension portion, and the second extension portion are a single piece of resin.

5. The semiconductor device according to claim 4, wherein
the second extension portion has a first wall extending along a side surface of the first heatsink and a second wall extending along a side surface of the second heatsink,
the side surface of the first heatsink is in contact with and covered with the first wall, and
the side surface of the second heatsink is in contact with and covered with the second wall.

6. The semiconductor device according to claim 3, further comprising:
a lead terminal connectable to external circuitry; and
an electrically insulating layer, wherein
the semiconductor element further includes a lead terminal electrode pad that is located on the front surface and exposed to the front side of the outer surface of the resin member, the first heatsink has a heatsink-side pad that is located facing the lead terminal electrode pad and connected to the lead terminal, the insulating layer is located between the first heatsink and each of the heatsink-side pad and the lead terminal to electrically insulate the first heatsink from the heatsink-side pad and the lead terminal, and the first heatsink is pressed against the semiconductor element in such a manner that the heatsink-side pad is in direct contact with and electrically connected to the lead terminal electrode pad.

7. The semiconductor device according to claim 1, further comprising:

a first resin sheet made of thermoplastic resin and having first and second surfaces opposite to each other, the first resin sheet including a first conductive member extending from the first surface to the second surface of the first resin sheet; and a second resin sheet made of thermoplastic resin and having first and second surfaces opposite to each other, the second resin sheet including a second conductive member extending from the first surface to the second surface of the second resin sheet, wherein the first surface of the first resin sheet is in direct contact with the front side of the outer surface of the resin member in such a manner that the front surface of the semiconductor element is covered with the first resin sheet and that the front-surface electrode is electrically connected to the first conductive member, the first surface of the second resin sheet is in direct contact with the back side of the outer surface of the resin member in such a manner that the back surface of the semiconductor element is covered with the second resin sheet and that the back-surface electrode is electrically connected to the second conductive member.

8. The semiconductor device according to claim 7, wherein the first resin sheet and the second resin sheet are made of the same thermoplastic resin material.

9. The semiconductor device according to claim 7, wherein at least one of the first resin sheet and the second resin sheet is configured as a multilayer sheet including a plurality of thermoplastic resin layers that are thermally fusion-bonded together, each resin layer of the multilayer sheet has a conductor penetrating therethrough in its thickness direction, the conductor defining at least one of the first conductive member and the second conductive member, and the conductors of adjacent resin layers are electrically connected through a conductive pattern located between the adjacent resin layers.

10. The semiconductor device according to claim 9, further comprising:

a connector located outside the side surface of the semiconductor element with a space therebetween, wherein the first resin sheet is configured as the multilayer sheet, the plurality of thermoplastic resin layers includes a first layer and a second layer, the first layer located closer to the semiconductor element than any other resin layer, the second layer located adjacent to the first layer, the first layer is in contact with and encapsulates the connector to fill the space between the semiconductor element and the connector, the semiconductor element further includes a connector pad located on the front surface, the first layer includes a connector conductor and a pad conductor, the connector conductor penetrates the first layer in its thickness direction and is electrically connected to the connector, the pad conductor penetrates the first layer in its thickness direction and is electrically connected to the connector pad, and the connector conductor and the pad conductor are electrically connected together through the conductive pattern that is located between the first layer and the second layer.

11. The semiconductor device according to claim 7, further comprising:

a first heatsink having a heat radiation property and an electrical conductivity and located on the second surface of the first resin sheet; and a second heatsink having a heat radiation property and an electrical conductivity and located on the second surface of the second resin sheet, wherein the first heatsink is in direct contact with the second surface of the first resin sheet and electrically connected to the first conductive member of the first resin sheet, the second heatsink is in direct contact with the second surface of the second resin sheet and electrically connected to the second conductive member of the second resin sheet, the first resin sheet is fusion-bonded to the first heatsink, and the second resin sheet is fusion-bonded to the second heatsink.

12. The semiconductor device according to claim 7, further comprising:

a first heatsink having a heat radiation property and an electrical conductivity and located on the second surface of the first resin sheet; and a second heatsink having a heat radiation property and an electrical conductivity and located on the second surface of the second resin sheet, wherein the first heatsink is in direct contact with the second surface of the first resin sheet and electrically connected to the first conductive member of the first resin sheet, the second heatsink is in direct contact with the second surface of the second resin sheet and electrically connected to the second conductive member of the second resin sheet, the first heatsink is pressed against the first resin sheet in such a manner that the first heatsink and the first resin sheet are bonded together, and the second heatsink is pressed against the second resin sheet in such a manner that the second heatsink and the second resin sheet are bonded together.

13. The semiconductor device according to claim 1, wherein the front-surface electrode is in direct contact with the front surface, and the back-surface electrode is in direct contact with the back surface.

* * * * *